United States Patent
Yamazawa et al.

(10) Patent No.: US 8,398,815 B2
(45) Date of Patent: *Mar. 19, 2013

(54) PLASMA PROCESSING APPARATUS

(75) Inventors: Yohei Yamazawa, Nirasaki (JP); Naohiko Okunishi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 811 days.

This patent is subject to a terminal disclaimer.

(21) Appl. No.: 12/271,461

(22) Filed: Nov. 14, 2008

(65) Prior Publication Data

US 2009/0133839 A1    May 28, 2009

Related U.S. Application Data

(60) Provisional application No. 61/024,402, filed on Jan. 29, 2008.

(30) Foreign Application Priority Data

Nov. 14, 2007   (JP) .................................. 2007-295755

(51) Int. Cl.
*C23F 1/00* (2006.01)
*C23C 16/00* (2006.01)
*H01L 21/306* (2006.01)

(52) U.S. Cl. .......... 156/345.44; 156/345.52; 118/723 E; 118/725

(58) Field of Classification Search ............. 156/345.43, 156/345.44, 345.45, 345.46, 345.47; 118/715, 118/722, 723 R, 723 E; 315/111.21
See application file for complete search history.

(56) References Cited

U.S. PATENT DOCUMENTS

| | | | |
|---|---|---|---|
| 3,936,776 A * | 2/1976 | Sundquist | 333/202 |
| 5,502,430 A | 3/1996 | Takahashi et al. | |
| 6,252,354 B1 | 6/2001 | Collins et al. | |
| 6,476,689 B1 * | 11/2002 | Uchida et al. | 333/177 |
| 6,927,650 B2 | 8/2005 | Okamoto | |
| 7,712,436 B2 * | 5/2010 | Yamazawa | 118/723 HC |
| 2007/0284344 A1 * | 12/2007 | Todorov et al. | 219/121.54 |

FOREIGN PATENT DOCUMENTS

| | | |
|---|---|---|
| JP | 6-61072 | 3/1994 |
| JP | 8-168229 | 6/1996 |
| JP | 2004-165256 | 6/2004 |
| KR | 10-2005-0066233 | 6/2005 |
| KR | 10-0525961 | 10/2005 |

OTHER PUBLICATIONS

Office Action issued Aug. 9, 2010, in Korean Patent Application No. 10-2008-0112882, ( with English translation).

* cited by examiner

*Primary Examiner* — Maureen Gramaglia
(74) *Attorney, Agent, or Firm* — Rothwell, Figg, Ernst & Manbeck, P.C.

(57) ABSTRACT

A plasma processing apparatus includes a processing chamber, a first radio frequency power supply for outputting a first radio frequency power, the first radio frequency power supply being electrically connected to a first electrode arranged in the processing chamber, a heater power supply for supplying electric power to a heating element provided in the first electrode, first and second power supply lines for electrically interconnecting the heating element and the heater power supply, and a filter circuit provided in the first and second power supply lines for attenuating radio frequency noises coming from the heating element. The filter circuit includes a first and a second air-core coil respectively provided on the first and the second power supply line at an initial stage of the filter circuit when viewed from the heating element, the air-core coils being in a coaxial relationship with each other and having substantially the same winding length.

32 Claims, 13 Drawing Sheets

PLASMA PROCESSING APPARATUS

FIELD OF THE INVENTION

The present invention relates to a plasma processing apparatus for performing plasma processing on a target object using radio frequency power and, more particularly, to a plasma processing apparatus provided with a filter circuit for attenuating undesired radio frequency noises.

BACKGROUND OF THE INVENTION

In the microprocessing for manufacturing semiconductor devices or flat panel displays (FPD), it is of paramount importance to control a plasma density distribution, a temperature and the temperature distribution on the substrate to be processed (e.g., a semiconductor wafer and a glass substrate). If the temperature of the substrate is not properly controlled, it is difficult to secure process uniformity on the surface of the substrate, which leads to a reduced production yield of semiconductor devices and display devices.

In general, a mounting table or susceptor for mounting thereon a substrate to be processed inside a chamber of a plasma processing apparatus, particularly a capacitively coupled plasma processing apparatus, functions as a radio frequency electrode for applying a radio frequency power to a plasma space, as a support unit for supporting a substrate, e.g., by electrostatic attraction and as a temperature control unit for controlling the substrate at a predetermined temperature by heat conduction. The mounting table serving as the temperature control unit is required to properly compensate a heat distribution caused by a substrate supporting structure or a heat input characteristic distribution on the substrate caused by nonuniformity of a radiant heat from a plasma or a chamber wall.

Conventionally, in order to control a temperature of an upper surface of a susceptor (and eventually the temperature of a substrate), there has been frequently used a method for supplying a coolant whose temperature is controlled by a chiller unit into the coolant passageway provided inside a susceptor or a susceptor supporting table to be circulated therein. However, this chiller method encounters a difficulty in rapidly changing the coolant temperature and suffers from reduced responsiveness in temperature control. Thus, the chiller method has a shortcoming in that it is incapable of performing temperature change or raising and lowering of a temperature at a high speed. In an up-to-date process, e.g., in a plasma etching field, there is a need to successively process a multi-layered film of a substrate to be processed within a single chamber instead of multiple chambers used conventionally. The technique of raising and lowering the temperature of a mounting table at a high speed is essential in realizing the single-chamber processing. Under these circumstances, a heater method may be proposed for rapidly and accurately controlling a susceptor temperature and hence a substrate temperature by controlling Joule heat generated by a heating element which is installed in the susceptor to generate heat when energized (see, e.g., Japanese Patent Laid-open Application No. 2006-286733).

In case where a lower electrode high frequency application type in which a radio frequency power supply is connected to a susceptor for plasma control purposes is used in combination with the afore-mentioned heater method in which the heating element is provided in the susceptor for temperature control purposes, the operation or performance of a heater power supply may be impaired if a part of the radio frequency power applied from the radio frequency power supply to the susceptor flows into the heater power supply through the heating element and the heater power supply line as a noise. In particular, the heater power supply, which can be controlled at a high speed, is subjected to highly sensitive switching control or on/off control through the use of a semiconductor switching element such as a solid state relay (SSR) or the like. Therefore, the heater power supply is susceptible to erroneous operation if radio frequency noises flow into the same. In view of this, it is typical that the heater power supply line is provided with a filter circuit for sufficiently attenuating undesired radio frequency noises.

In general, this kind of filter circuit includes LC low-pass filters connected to one another in multistage like a ladder, each of which has a single coil (inductor) and a single capacitor. Assuming that a noise attenuation ratio per LC low-pass filter is equal to, e.g., $1/10$, the radio frequency noise can be attenuated to $1/100$ if the LC low-pass filters are connected in two stages and $1/1000$ if the LC low-pass filters are connected in three stages.

As stated above, in the conventional plasma processing apparatus, the function of the filter circuit provided in the heater power supply line is focused on attenuation of the radio frequency noises, which flow from the radio frequency power supply to the heater power supply through the susceptor, in an effort to keep normal the operation or performance of the heater power supply. Thus, a low-inductance coil and a high-capacitance capacitor are used in the LC low-pass filters of each stage in the filter circuit.

During the process of developing and evaluating a plasma processing apparatus in which a lower electrode high frequency application type and a heater are used in combination in a susceptor, the present inventors have found that the aforementioned conventional filter circuit has a problem in terms of process performance. More specifically, it is well-known that there exists a correlation between the power loss of a radio frequency power applied from a radio frequency power supply to a susceptor and the process performance (e.g., an etching rate), according to which the process performance is reduced as the radio frequency power loss becomes greater. The present inventors were able to learn that a significant amount of radio frequency power loss not negligible in terms of the process performance occurs in the conventional filter circuit. Furthermore, the present inventors were able to find that there is a variance (apparatus-dependent difference) in the amount of radio frequency power loss between plasma processing apparatuses even if they are of the same nature, which leads to an apparatus-dependent difference in the process performance. Under this critical mind, the present inventors have repeatedly conducted experiments and researches and have succeeded in finalizing the present invention.

SUMMARY OF THE INVENTION

In view of the above, the present invention provides a plasma processing apparatus with a filter circuit for attenuating an undesired radio frequency noise, which is capable of greatly reducing the radio frequency power loss in the filter circuit and the apparatus-dependent difference (inter-apparatus variance) in the radio frequency power loss, thereby improving the reproducibility and reliability of process performance.

In accordance with a first aspect of the present invention, there is provided a plasma processing apparatus including: a processing chamber capable of being depressurized; a first electrode arranged in the processing chamber, the first electrode being provided with a heating element; a first radio frequency power supply for outputting a first radio frequency power, the first radio frequency power supply being electrically connected to the first electrode; a heater power supply for supplying an electric power to the heating element; a first and a second power supply line for electrically interconnecting the heating element and the heater power supply; and a filter circuit provided on the first and the second power supply line for attenuating radio frequency noises coming from the heating element.

Further, the filter circuit includes a first and a second air-core coil respectively provided on the first and the second power supply line at an initial stage of the filter circuit when viewed from the heating element, the air-core coils being in a coaxial relationship with each other and having substantially the same winding length.

In the plasma processing apparatus of the first aspect, the coils provided at the initial stage of the filter circuit are air-core coils. Therefore, by rendering the inductances of the air-core coils to be very high, it is possible to greatly reduce the radio frequency power loss as compared to a coil having low inductance or a coil with a magnetic core made of ferrite or the like. Furthermore, since the first and the second air-core coil, which form the initial stage coils of the filter circuit, are coaxial with each other and have substantially the same winding length, it is possible to prevent or restrain the filter circuit from suffering from an unusual abnormal increase in the frequency characteristics of the real resistance component. This makes it possible to improve the reproducibility of process performance.

Further, in the plasma processing apparatus of the first aspect, it is preferable that the first and the second air-core coil have a winding length ratio close to 1. More preferably, the winding length ratio is equal to exactly 1. In order to allow the first and the second air-core coil to have the same self-inductance, it is preferred that the air-core coils have the same diameter. Further, to obtain the maximum mutual inductance, it is preferred that the air-core coils are arranged concentrically.

In accordance with a second aspect of the present invention, there is provided a plasma processing apparatus including: a processing chamber capable of being depressurized; a first electrode arranged in the processing chamber, the first electrode being provided with a heating element; a first radio frequency power supply for outputting a first radio frequency power, the first radio frequency power supply being electrically connected to the first electrode; a heater power supply for supplying an electric power to the heating element; a first and a second power supply line for electrically interconnecting the heating element and the heater power supply; and a filter circuit provided on the first and the second power supply line for attenuating radio frequency noises coming from the heating element.

Further, the filter circuit includes a first and a second air-core coil respectively provided on the first and the second power supply line at an initial stage of the filter circuit when viewed from the heating element, each of the air-core coils having a first and a second conductive coil wire, wires in each pair of a pair of the first wires and a pair of the second wires being spirally wound side-by-side around an outer circumferential surface of a common bobbin with a substantially same winding length.

In the plasma processing apparatus of the second aspect, the coils provided at the initial stage of the filter circuit are air-core coils. Therefore, by making the inductances of the air-core coils to be very high, it is possible to greatly reduce the radio frequency power loss as compared to a coil having low inductance or a coil with a magnetic core made of ferrite or the like. Furthermore, since the air-core coils provided as the initial stage coils have the first and the second conductive coil wires respectively spirally wound around the outer circumferential surfaces of wires common bobbins with substantially the same winding lengths and since wires in each pair of the first and the second conductive coil wires wound side by side on the outer circumferential surface of the common bobbin, it is possible to prevent or restrain the filter circuit from suffering from an unusual abnormal increase in the frequency characteristics of the real resistance component. This makes it possible to improve the reproducibility of process performance.

In the plasma processing apparatus of the second aspect, it is preferable that wires in each pair of the first and second conductive coil wires are alternately disposed in an axial direction of the bobbin to assure efficiency in the coil size and to maximize the inductance. It is also preferable that at least one of the wires in each pair is coated with an insulation material to prevent occurrence of short-circuit. It is also preferable that the first and the second conductive coil wires are formed of rectangular or sheet-like copper wires to assure increased density and enhanced stability of the dual air-core coil structure assembly.

The air-core coils may be received or arranged in a conductive casing of ground potential to enhance stability of the function of the filter. Each of the air-core coils may preferably be divided into a plurality of electrically serially connected air-core coil subunits arranged in the casing in a spatially parallel relationship. Thus, it is possible to increase total inductance of the air-core coils in a limited space of the casing. In this case, it is preferable that the number of windings of an air-core coil subunit of each air-core coil closest to the heating element is set as great as possible in order to reduce the total stray capacitance of each air-core coil. It is also preferable that the stray capacitance of the closest air-core coil subunit is kept as small as possible.

The heating element may be embedded in an insulator under a main surface of the first electrode. Preferably, the heating element may be embedded in the insulator of an electrostatic chuck. Furthermore, there is provided a second electrode facing the first electrode in parallel in the processing chamber, with a specified gap left between the first electrode and the second electrode. A second radio frequency power supply for outputting a second radio frequency power having a frequency (e.g., 40 MHz or more) higher than that (e.g., 13.56 MHz or less) of the first radio frequency power may be electrically connected to the second electrode.

In accordance with a third aspect of the present invention, there is provided a plasma processing apparatus including: a processing chamber capable of being depressurized in which plasma processing is performed by using radio frequency power; an electric part provided in the processing chamber; an external power or signal circuit provided outside the processing chamber, the external circuit being electrically connected to the electric part via a first and a second line; and a filter circuit provided in the first and the second line for attenuating radio frequency noises coming into the first and the second line through the electric part. Further, the filter circuit includes a first and a second air-core coil respectively provided on the first and the second line at an initial stage of the filter circuit when viewed from the electric part, the air-core coils being in a coaxial relationship with each other and having substantially the same winding length.

In the plasma processing apparatus of the third aspect, the coils provided at the initial stage of the filter circuit are air-core coils. Therefore, by rendering the inductances of the air-core coils to be very high, it is possible to greatly reduce the radio frequency power loss as compared to a coil having low inductance or a coil with a magnetic core made of ferrite or the like. Furthermore, since the first and the second air-core coil, which form the initial stage coils of the filter circuit, are coaxial with each other and have substantially the same winding length, it is possible to prevent or restrain the filter circuit from suffering from an unusual abnormal increase in the frequency characteristics of the real resistance component. This makes it possible to improve the reproducibility of process performance.

Furthermore, it is preferable that the first and the second air-core coil have a winding length close to 1. More preferably, the winding length ratio is equal to exactly 1. In order to allow the first and the second air-core coil to have the same self-inductance, it is preferred that the air-core coils have the same diameter. Further, to obtain the maximum mutual inductance, it is preferred that the air-core coils are arranged concentrically.

In accordance with a fourth aspect of the present invention, there is provided a plasma processing apparatus including: a processing chamber capable of being depressurized in which plasma processing is performed by using radio frequency power; an electric part provided within the processing chamber; an external power or signal circuit provided outside the processing chamber, the external circuit being electrically connected to the electric part via a first and a second line; and a filter circuit provided in the first and the second line for attenuating radio frequency noises coming into the first and the second line through the electric part. The filter circuit includes a first and a second air-core coil respectively provided on the first and the second line at an initial stage of the filter circuit when viewed from the electric part, each of the air-core coils having a first and a second conductive coil wire, wires in each pair of a pair of the first wires and a pair of the second wires being spirally wound around an outer circumferential surface of a common bobbin with a substantially same winding length.

In the plasma processing apparatus of the fourth aspect, the coils provided at the initial stage of the filter circuit are air-core coils. Therefore, by rendering the inductances of the air-core coils to be very high, it is possible to greatly reduce the radio frequency power loss as compared to a coil having low inductance or a coil with a magnetic core made of ferrite or the like. Furthermore, since the air-core coils provided as the initial stage coils have the first and the second conductive coil wires respectively spirally wound around outer circumferential surfaces of common bobbins with substantially the same winding lengths and since wires in each pair of the first and the second conductive coil wires wound side by side on the outer circumferential surface of the common bobbin, it is possible to prevent or restrain the filter circuit from suffering from an unusual abnormal increase component in the frequency characteristics of the real resistance. This makes it possible to improve the reproducibility of process performance.

Furthermore, in the plasma processing apparatus of the fourth aspect, wires in each pair of the first and the second conductive coil wires may be alternately disposed in an axial direction of the bobbin to assure efficiency in the coil size and to maximize the inductance. It is preferable that at least one of wires in each pair is coated with an insulation material to prevent occurrence of short-circuit. It is also preferable that the first and the second conductive coil wires are formed of rectangular or sheet-like copper wires to assure increased density and enhanced stability of the dual air-core coils structure assembly.

It is possible to arbitrarily select the radio frequency noises to be attenuated or interrupted by the filter circuit. For example, the radio frequency noises to be attenuated may be noises from radio frequency power contributing primarily to the generation of plasma of a processing gas within the processing chamber, noises from radio frequency power contributing primarily to the attraction of ions from plasma into an object to be processed within the processing chamber, or radio frequency noises due to harmonics or intermodulation distortions generated from plasma in the processing chamber.

In accordance with the plasma processing apparatus of the present invention including a filter circuit for attenuating an undesired radio frequency noises, it is possible to greatly reduce the radio frequency power loss in the filter circuit and the apparatus-dependent difference (inter-apparatus variance) in the radio frequency power loss, thereby improving the reproducibility and reliability of process performance.

BRIEF DESCRIPTION OF THE DRAWINGS

The object and features of the present invention will become apparent from the following description of embodiments given in conjunction with the accompanying drawings, in which.

DETAILED DESCRIPTION OF THE EMBODIMENTS

Hereinafter, an exemplary embodiment of the present invention will be described with reference to FIGS. 1 to 17, which form a part hereof.

Figure 1:
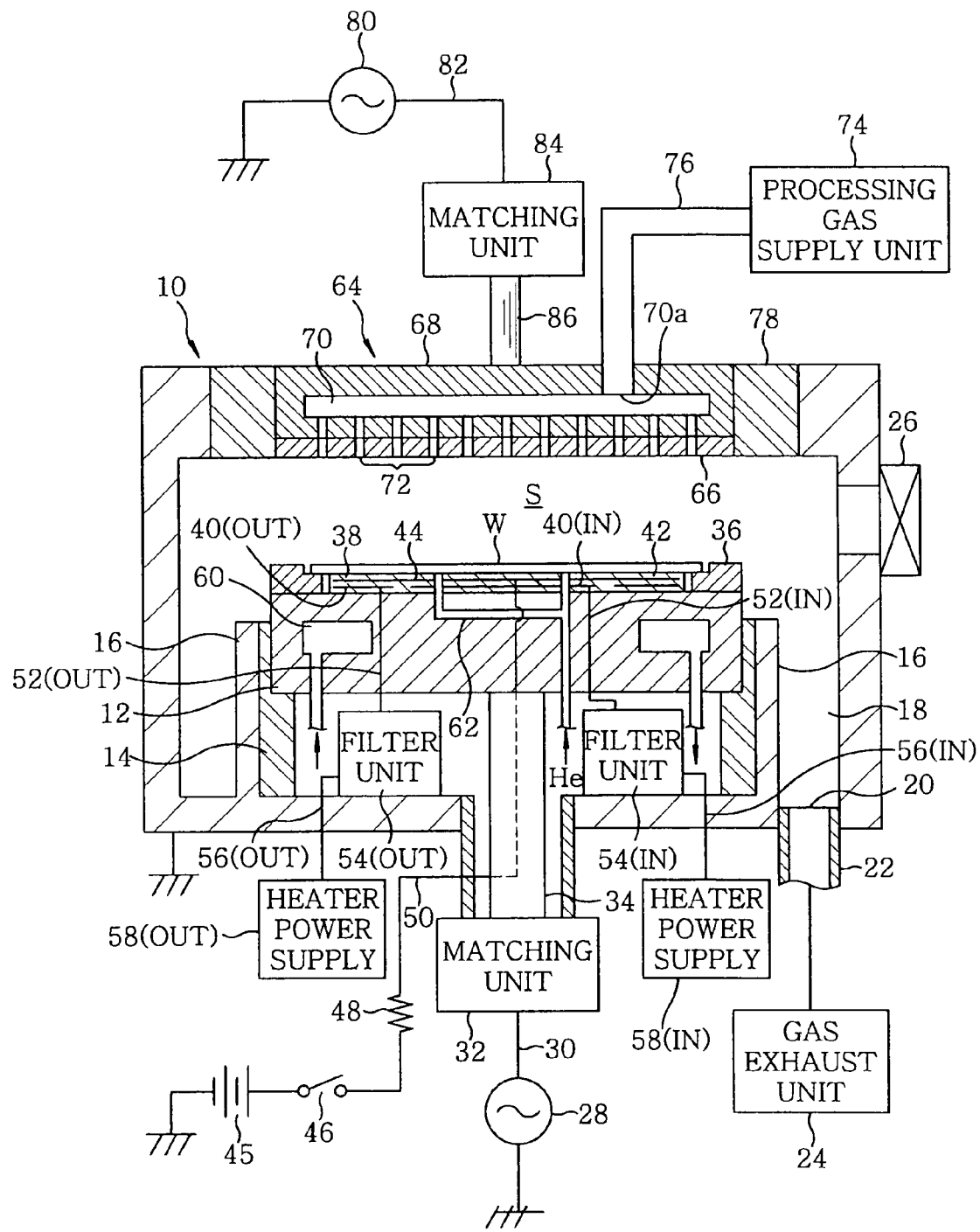
FIG. 1 is a vertical section view showing a plasma processing apparatus in accordance with an embodiment of the present invention.

FIG. 1 shows a configuration of a plasma processing apparatus in accordance with one embodiment of the present invention. The plasma processing apparatus is constructed as a lower and upper electrode dual frequency application type capacitively coupled plasma etching apparatus, and includes a cylindrical chamber (processing chamber) 10 made of a metallic material such as aluminum, stainless steel or the like. The chamber 10 is frame-grounded.

A circular plate-shaped susceptor 12 serving as a lower electrode for mounting thereon a substrate to be processed, e.g., a semiconductor wafer W, is horizontally arranged in the chamber 10. The susceptor 12 is made of, e.g., aluminum, and is supported by cylindrical insulating support 14 made of, e.g., ceramic, which vertically extends from a bottom of the chamber 10, without being grounded. An annular gas exhaust path 18 is formed between the inner wall of the chamber 10 and a cylindrical conductive supporting portion 16 vertically extending from the bottom of the chamber 10 along the periphery of the cylindrical insulating support 14. a gas exhaust port 20 is provided in the bottom portion of the gas exhaust path 18. A gas exhaust unit 24 is connected to the gas exhaust port 20 via a gas exhaust line 22. The gas exhaust unit 24 includes a vacuum pump such as a turbo molecular pump or the like so that a plasma processing space in the chamber 10 can be depressurized to a desired vacuum level. A gate valve 26 for opening and closing a loading/unloading port for the semiconductor wafer is provided on the sidewall of the chamber 10.

A first radio frequency power supply 28 is electrically connected to the susceptor 12 through a radio frequency (RF) cable 30, a lower matching unit 32 and a lower power feed rod 34. In this regard, the first radio frequency power supply 28 outputs a first radio frequency power of a predetermined frequency, e.g., 13.56 MHz, for ion attraction onto the semiconductor wafer W mounted on the susceptor 12. The RF cable 30 is formed of, e.g., a coaxial cable. The lower matching unit 32 includes a matching circuit for matching an impedance of the first radio frequency power supply 28 with that of loads (mainly including the electrode and the plasma) and a RF sensor for an automatic matching operation, a controller, a stepping motor and so forth.

The susceptor 12 has a diameter much greater than that of the semiconductor wafer W. The main surface, i.e., upper surface, of the susceptor 12 is radially divided into a central region, i.e., a wafer mounting portion, which is substantially the same in shape (circular shape) and size as the semiconductor wafer W, and an annular peripheral portion extending radially outwardly from the wafer mounting portion. The semiconductor wafer W to be processed is mounted on the wafer mounting portion. A focus ring 36 having an inner diameter a little greater than the diameter of the semiconductor wafer W is attached on the annular peripheral portion. The focus ring 36 is made of one of, e.g., Si, SiC, C and $SiO_2$, depending on the nature of etched materials of the semiconductor wafer W.

In the wafer mounting portion on the upper surface of the susceptor 12, there are provided an electrostatic chuck 38 for attractingly holding the semiconductor wafer W and a heating element 40. The electrostatic chuck 38 includes a film-like or plate-like dielectric 42 integrally formed on or integrally fixed to the upper surface of the susceptor 12 and a conductor 44 of, e.g., mesh shape, enclosed within the dielectric 42. An external DC power supply 45 arranged outside the chamber 10 is electrically connected to the conductor 44 via a switch 46, a resistor 48 with a high resistance value, and a DC high-voltage line 50. The semiconductor wafer W is attractingly held on the electrostatic chuck 38 by the Coulomb force generated when the DC power supply 45 applies a DC high voltage to the conductor 44. The DC high-voltage line 50 is a coated wire and extends through the lower power feed rod 34 of cylindrical shape. The DC high-voltage line 50 penetrates the susceptor 12 from below and is connected to the conductor 44 of the electrostatic chuck 38.

Figure 2:
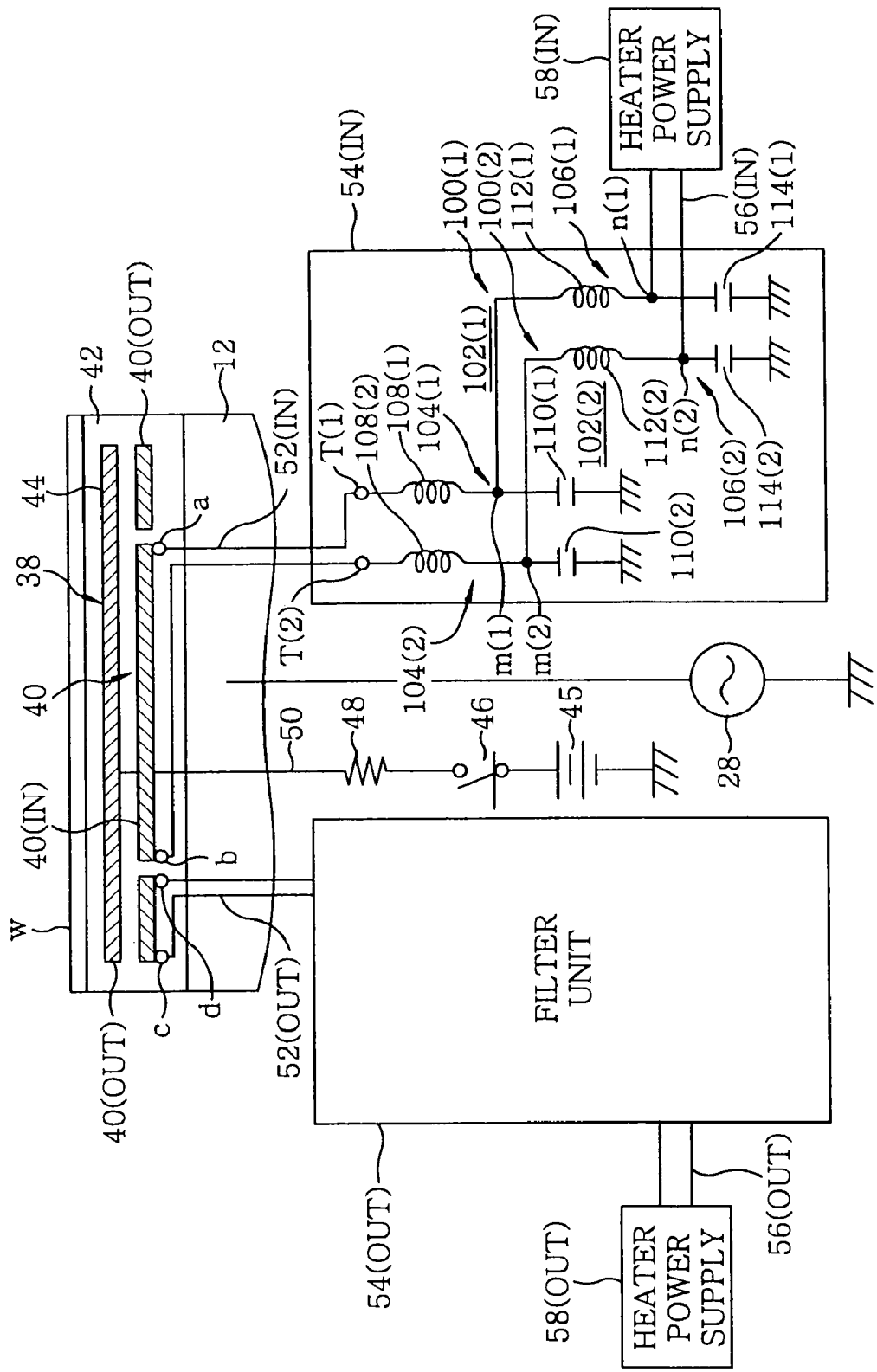
FIG. 2 is a view showing a circuit configuration of a power supply unit for supplying electric power to a heating element of a susceptor in the embodiment.
Figure 3:
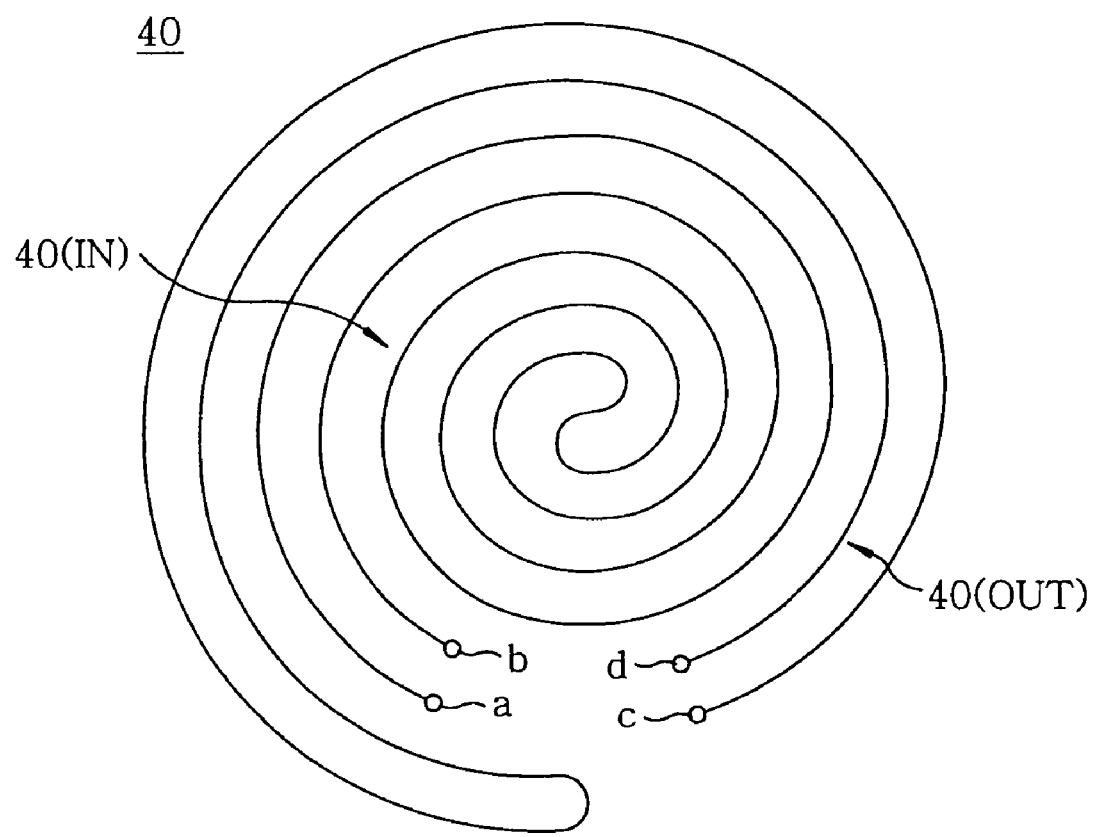
FIG. 3 is a view illustrating a configuration example of the heating element in the embodiment.

The heating element 40 is formed of a resistance heating wire of, e.g., spiral shape, enclosed within the dielectric 42 together with the conductor 44 of the electrostatic chuck 38. In the present embodiment, the heating element 40 is divided into an inner heating wire 40(IN) and an outer heating wire 40(OUT) along a radial direction of the susceptor 12, as illustrated in FIGS. 2 and 3. The inner heating wire 40(IN) is electrically connected to a dedicated heater power supply 58(IN) arranged outside the chamber 10, via an insulation-coated power supply conductor 52(IN), a filer unit 54(IN) and an electric cable 56(IN). Similarly, the outer heating wire 40(OUT) is electrically connected to a dedicated heater power supply 58(OUT) arranged outside the chamber 10, via an insulation-coated power supply conductor 52(OUT), a filer unit 54(OUT) and an electric cable 56(OUT). Among them, the filter units 54(IN) and 54(OUT) constitute a major feature of the present embodiment, the internal construction and operation of which will be described in detail later.

An annular coolant path 60 extending, e.g., in a circumferential direction is provided in the susceptor 12. A coolant of a predetermined temperature supplied from an external chiller unit (not shown) via a pipeline is allowed to flow through the coolant path 60. The temperature of the semiconductor wafer W placed on the electrostatic chuck 38 can be controlled depending on the temperature of the coolant. In order to accurately control the temperature of the semiconductor wafer W, a thermally conductive gas, e.g., He gas, from a thermally conductive gas supply unit (not shown) is supplied to between the electrostatic chuck 38 and the semiconductor wafer W via a gas supply pipe and a gas path 62 formed in the susceptor 12.

A shower head 64 serving as an upper electrode is provided to face the susceptor 12 in parallel at the ceiling of the chamber 10. The shower head 64 includes an electrode plate 66 facing the susceptor 12 and an electrode holder 68 attachably and detachably holding the electrode plate 66 from the back (upper) side thereof. A gas chamber 70 is formed within the electrode holder 68. A plurality of gas injection holes 72 extending from the gas chamber 70 toward the susceptor 12 is formed in the electrode holder 68 and the electrode plate 66. The space S left between the electrode plate 66 and the susceptor 12 constitutes a plasma generation space or a processing space. A gas inlet port 70a is provided at a top portion of the gas chamber 70. A gas supply pipe 76 extending from a processing gas supply unit 74 is connected to the gas inlet port 70a. The electrode plate 66 is made of, e.g., Si, SiC or C, and the electrode holder 68 is made of, e.g., alumite-processed aluminum.

A ring-shaped insulator 78 made of, e.g., alumina, is airtightly fitted between the shower head 64 and the edge portion of a top opening of the chamber 10. The shower head 64 is attached to the chamber 10 in an electrically floating state, i.e., in a non-grounded state. A second radio frequency power supply 80 is electrically connected to the shower head 64 via a RF cable 82, an upper matching unit 84 and an upper power feed rod 86. In this regard, the second radio frequency power supply 80 outputs a second radio frequency power of a predetermined frequency, e.g., 60 MHz, which contributes primarily to generation of plasma. The RF cable 82 is formed of, e.g., a coaxial cable. The upper matching unit 84 receives a matching circuit for matching an impedance of the second radio frequency power supply 80 with that of loads (mainly including electrodes and plasma) and includes a RF sensor for an automatic matching operation, a controller, a stepping motor and so forth.

The operation of each of the respective parts arranged within the plasma etching apparatus, e.g., the gas exhaust unit 24, the radio frequency power supplies 28 and 80, the switch 46 of the DC power supply 45, the heater power supplies 58(IN) and 58(OUT), the chiller unit (not shown), the a thermally conductive gas supply unit (not shown) and the processing gas supply unit 74, and the operation (sequence) of the apparatus as a whole are controlled by an apparatus control unit (not shown) including, e.g., a microcomputer.

In order to carry out an etching in the plasma etching apparatus, the gate valve 26 is first opened. In this state, the semiconductor wafer W to be processed is loaded into the chamber 10 and mounted on the electrostatic chuck 38. Thereafter, an etching gas (generally a gaseous mixture) is introduced from the processing gas supply unit 74 into the chamber 10 at a predetermined flow rate, and the pressure within the chamber 10 is regulated to a pre-set value using the gas exhaust unit 24. Furthermore, the first and the second radio frequency power supply 28 and 80 are turned on so as to output the first radio frequency power of 13.56 MHz and the second radio frequency power of 60 MHz at a predetermined power levels. The first and the second radio frequency power are respectively supplied to the susceptor (lower electrode) 12 and the shower head (upper electrode) 64 via the RF cables 30 and 82, the matching units 32 and 84 and the power feed rods 34 and 86. The switch 46 is also turned on so that a thermally conductive gas (He gas) can be confined in the interfacial contact surface between the electrostatic chuck 38 and the semiconductor wafer W under the action of an electrostatic attraction force. A coolant having a specified controlled temperature is supplied from the chiller unit to the coolant path 60 formed within the susceptor 12. The heater power supplies 58(IN) and 58(OUT) are turned on to enable the inner heating element 40(IN) and the outer heating element 40(OUT) to generate Joule heat independently of each other, thereby controlling the temperature or the temperature distribution on the upper surface of the susceptor 12 to a pre-set value. The etching gas injected from the shower head 64 is turned to plasma by the radio frequency discharge between the opposite electrodes 12 and 64. The films on the main surface of the semiconductor wafer W are etched into a specified pattern by the radicals or ions which are generated in the plasma.

With the capacitively coupled plasma etching apparatus, the second radio frequency power of relatively high frequency, i.e., 60 MHz, suitable for plasma generation are applied to the shower head 64. This makes it possible to increase the density of plasma in a desirable dissociation state and to form high-density plasma even at a lower pressure condition. Concurrently, the first radio frequency power of relatively low frequency, i.e., 13.56 MHz, suitable for ion attraction is applied to the susceptor 12. This makes it possible to perform highly selective anisotropic etching on the semiconductor wafer W placed on the susceptor 12. Under normal conditions, the second radio frequency power may have an arbitrary frequency of 40 MHz or more.

Furthermore, with the capacitively coupled plasma etching apparatus, the susceptor 12 is cooled by the chiller and heated by the heater at the same time, and the heating operation of the heater is independently controlled in the radial center portion and the radial edge portion. This makes it possible to change or raise and lower the temperature at a high speed and to arbitrarily or differently control the temperature distribution profile.

Next, the configuration and operation of the filter units 54(IN) and 54(OUT) in which major features of the present embodiment reside will be described with reference to FIGS. 2 through 15.

Shown in FIG. 2 is a circuit configuration of a power supply unit for supplying electric power to the heating element 40 provided in the susceptor 12. In the present embodiment, individual power supply units having a substantially identical circuit configuration are connected to the inner heating wire 40(IN) and the outer heating wire 40(OUT) of the heating element 40 to independently control the quantity and temperature of the heat generated in the inner heating wire 40(IN) and the outer heating wire 40(OUT). Hereinafter, the configuration and operation of the power supply unit for the inner heating wire 40(IN) will be described. It is to be noted that the configuration and operation of the power supply unit for the outer heating wire 40(OUT) is the same as that for the inner heating wire 40(IN).

The heater power supply 58(IN) is an alternating current power supply that performs the switching (ON/OFF) operation of a commercial frequency using, e.g., a solid state relay. The heater power supply 58(IN) is connected to the inner heating element 40(IN) through a closed loop circuit. More specifically, the heater power supply 58(IN) has a pair of first and second output terminals, the first output terminal of which is electrically connected to a first terminal a of the inner heating wire 40(IN) through a first power supply line (power supply line) 100(1) and the second output terminal of which is electrically connected to a second terminal b of the inner heating wire 40(IN) through a second power supply line (power supply line) 100(2).

The filter unit 54(IN) includes a first and a second power supply line filter circuit 102(1) and 102(2) provided on the first and the second power supply line 100(1) and 100(2). The power supply line filter circuits 102(1) and 102(2) are substantially identical in their circuit configuration with each other. In the illustrated example, the power supply line filter circuit 102(1) (or 102(2)) includes an initial stage LC low-pass filter 104(1) (or 104(2)) and a next stage LC low-pass filter 106(1) (or 106(2)), both of which are connected to each other in an end-to-end relationship in a ladder form when viewed from the inner heating wire 40(IN).

More specifically, the initial stage LC low-pass filter 104 (1) (or 104(2)) is constructed from a serial circuit of an initial stage coil 108(1) (or 108(2)) and an initial stage capacitor 110(1) (or 110(2)). One terminal of the initial stage coil 108(1) (or 108(2)) or a filter terminal T(1) (or T(2)) is connected to the terminal a (or b) of the inner heating wire 40(IN) through a power supply conductor 52(IN), The initial stage capacitor 110(1) (or 110(2)) is connected between another terminal of the initial stage coil 108(1) (or 108(2)) and a ground potential portion.

The next stage LC low-pass filter 106(1) (or 106(2)) is constructed from a serial circuit of a next stage coil 112(1) (or 112(2)) and a next stage capacitor 114(1) (or 114(2)). One terminal of the next stage coil 112(1) (or 112(2)) is connected to a connection node m(1) (or m(2)) between the initial stage coil 108(1) (or 108(2)) and the initial stage capacitor 110(1) (or 110(2)). The next stage capacitor 114(1) (or 114(2)) is connected between another terminal of the next stage coil 112(1) (or 112(2)) and a ground potential portion. The connection node n(1) (or n(2)) between the next stage coil 112(1) (or 112(2)) and the next stage capacitor 114(1) (or 114(2)) is connected to the first (or the second) output terminal of the heater power supply 58(IN) via the electric cable (pair cable) 56(IN).

With the power supply unit of this construction, the electric current outputted from the heater power supply 58(IN) flows, in case of a positive pole cycle, from the terminal a to the inner heating wire 40(IN) via the first power supply line 100(1), i.e., the electric cable 56(IN), the next stage coil 112(1), the initial stage coil 108(1) and the power supply conductor 52(IN), thereby energizing the inner heating wire 40(IN) to generate Joule heat. Then, the electric current flows out of the terminal b and returns via the second power supply line 100(2), i.e., the power supply conductor 52(IN), the initial stage coil 108(2), the next stage coil 112(2) and the electric cable 56(IN). In case of a negative pole cycle, the electric current flows through the same circuit in the reverse direction. This alternating heater current has a commercial frequency, that is, the impedance or voltage drop in the initial stage coil 108(1) (or 108(2)) and the next stage coil 112(1) (or 112(2)) is negligibly small. Likewise, the electric current leaking to the earth via the initial stage capacitor 110(1) (or 110(2)) and the next stage capacitor 114(1) (or 114(2)) is also negligibly small.

Figure 4:
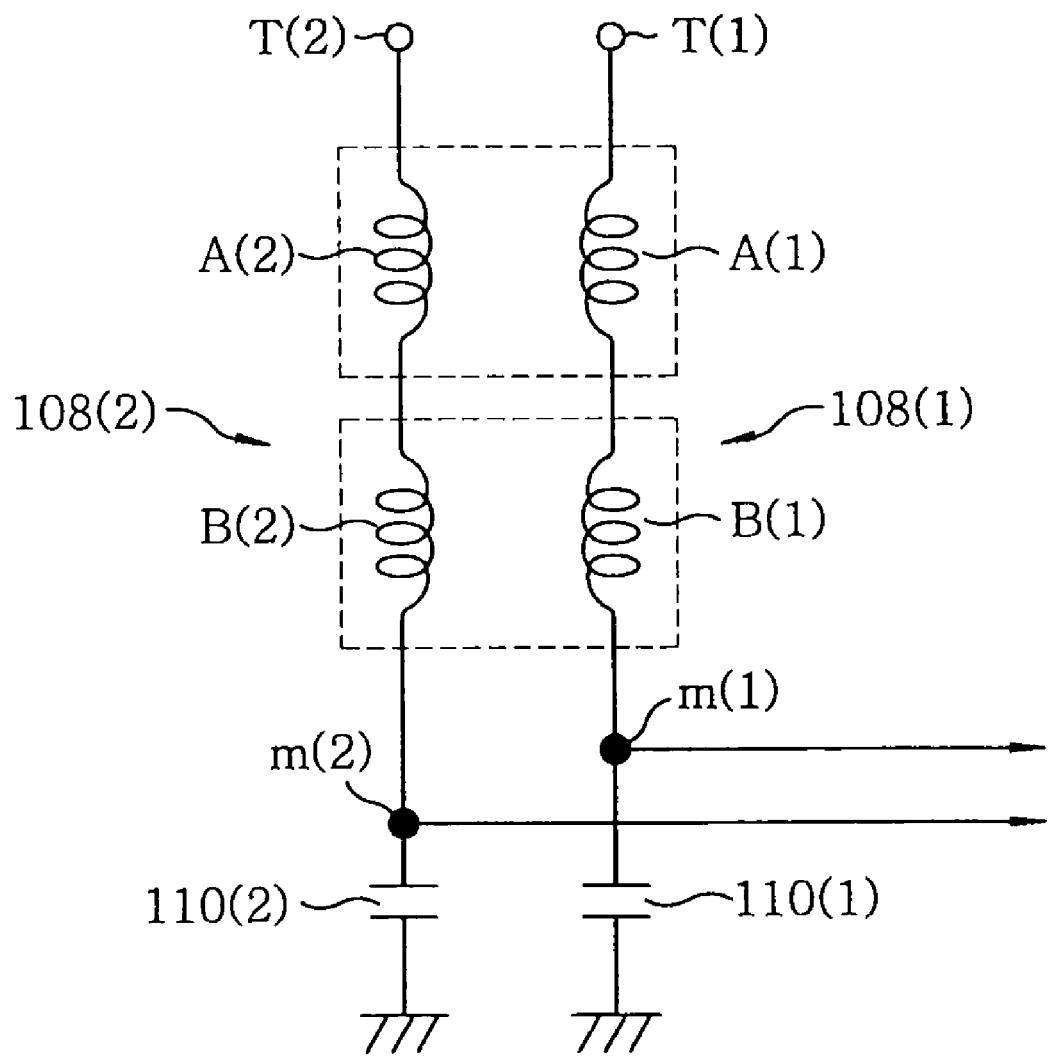
FIG. 4 is a view illustrating a circuit configuration of an initial stage coil in the embodiment.

One of the features of the present embodiment resides in that the initial stage coil 108(1) (or 108(2)) of the initial stage LC low-pass filter 104(1) (or 104(2)) is formed of an air-core coil to prevent heat generation from the initial stage coil 108(1) (or 108(2)) and preferably constructed from a plurality of, e.g., two, air-core coil subunits A(1) and B(1) (or A(2) and B(2)) electrically connected to each other in series as illustrated in FIG. 4 for size reduction of the installation space (especially, the vertical space). Another feature lies in that the air-core coil subunits A(1) and B(1) (or A(2) and B(2)) are provided in the filter unit 54(IN) to have a coil winding structure as illustrated in FIGS. 5 through 8.

As shown in FIG. 4, the two air-core coil subunits A(1) and B(1) that form the initial stage coil 108(1) of the initial stage LC low-pass filter 104(1) of the first power supply line 100(1) are electrically connected in series in the illustrated order when viewed from the inner heating wire 40(IN). The air-core coil subunit A(1) is arranged in the foremost position, i.e., in a position electrically closest to the filter terminal T(1). Similarly, the two air-core coils A(2) and B(2) that form the initial stage coil 108(2) of the initial stage LC low-pass filter 104(2) of the second power supply line 100(2) are electrically connected in series in the illustrated order when viewed from the inner heating wire 40(IN). The air-core coil subunit A(2) is arranged in the foremost position, i.e., in a position electrically closest to the filter terminal T(2).

Figure 5:
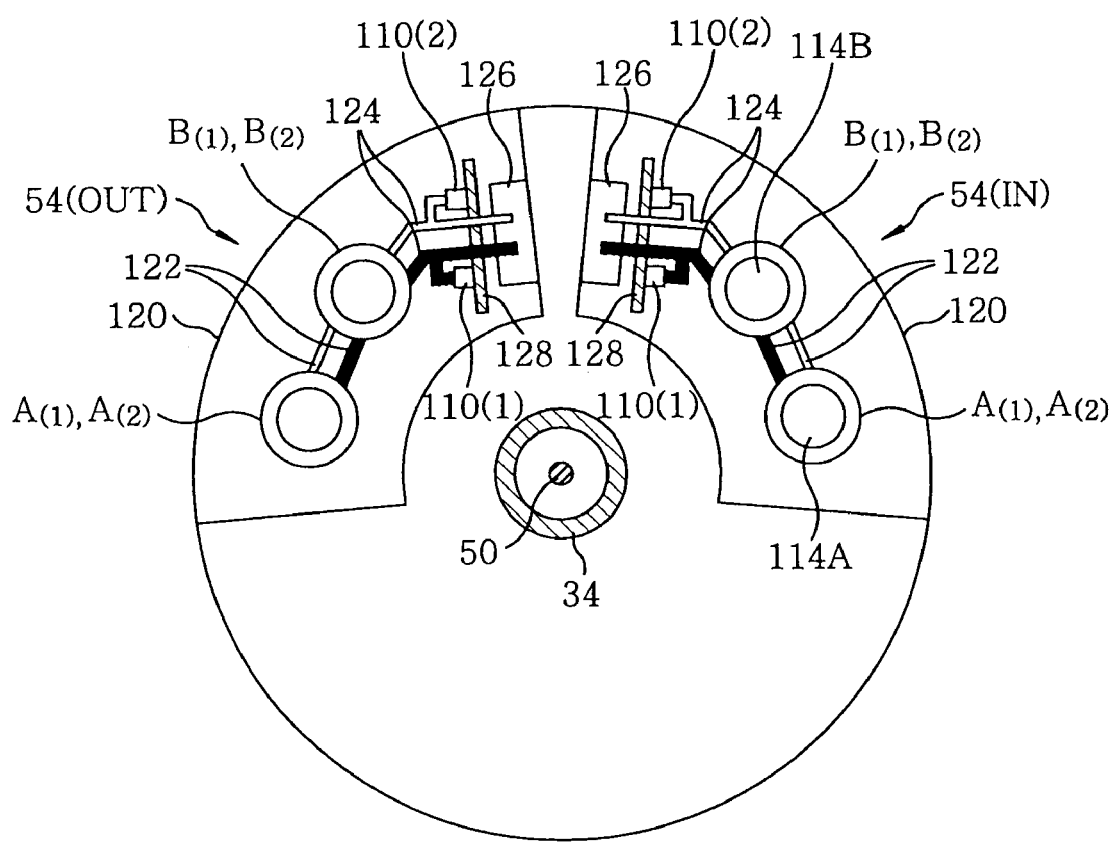
FIG. 5 is a plan view showing major configurations within a filter unit in the embodiment.
Figure 6:
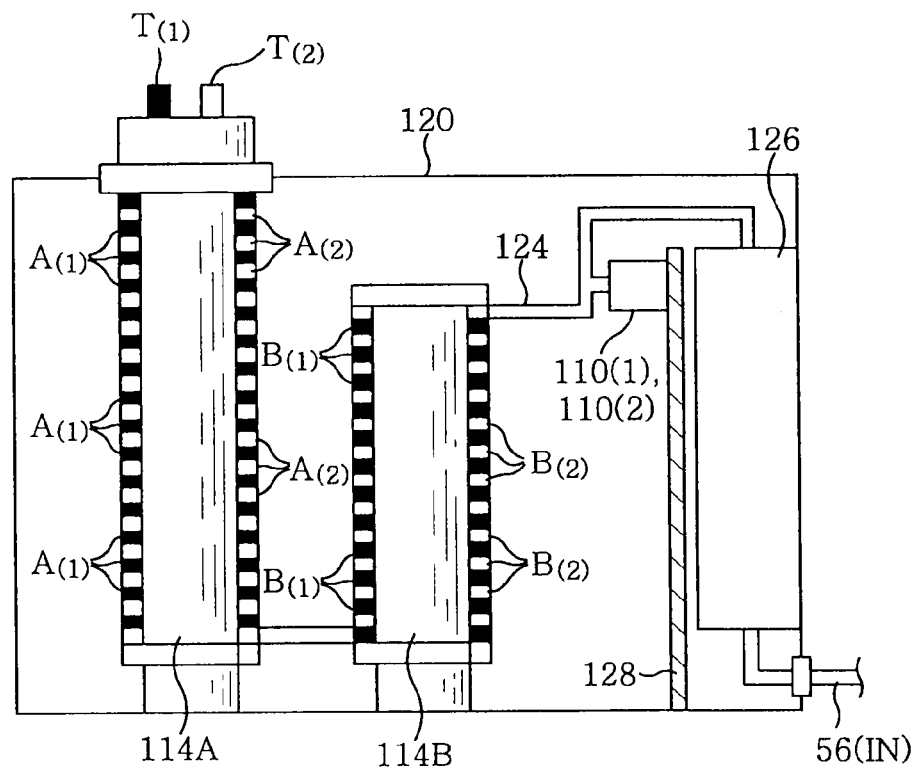
FIG. 6 is a schematic section view showing major configurations within a filter unit in the embodiment.

Referring to FIGS. 5 and 6, the filter unit 54(IN) includes a box-like cover or casing 120 formed of a conductive plate. Filter parts are all received within the casing 120. In particular, most of the internal space of the casing 120 is filled with the two air-core coil subunits A(1) and B(1) (or A(2) and B(2)) that form the initial stage coil 108(1) (or 108(2)). The initial stage capacitor 110(1) (or 110(2)) and the next stage LC low-pass filter 106(1) (or 106(2)) are arranged in one narrow corner space. As a material of which the casing 120 is made, it is preferable to use stainless steel with increased relative magnetic permeability, which is superior in magnetic shielding capability and antirust property.

Each of the air-core coil subunits A(1), B(1), A(2) and B(2) serves as a power supply line through which an electric current of high enough intensity (e.g., 30A) flows from the heater power supply 58(IN) to the inner heating wire 40(IN). In addition, each of the air-core coil subunits A(1), B(1), A(2) and B(2) does not have any magnetic core such as a ferrite core or the like but has an air core to prevent heat generation from the initial stage coil 108(1) (or 108(2)) (power loss). Further, to obtain high enough inductance, each of the air-core coil subunits A(1), B(1), A(2) and B(2) employs a thick coil wire and has a coil size (e.g., a diameter of 22 to 45 mm and a length of 150 to 250 mm), which goes against the common sense prevailing thus far.

In the present embodiment, the two air-core coil subunits A(1) and B(1) (or A(2) and B(2)) are mounted in the casing 120 with increased efficiency as a whole in terms of space and function. More specifically, the first stage air-core coil subunits A(1) and A(2) of the first and second power supply lines 100(1) and 100(2) are concentrically mounted to a hollow or a solid cylindrical upstanding bobbin 114A. The bobbin 114A is provided near one of circumferentially lateral side of the casing 120 and is an insulator which is made of, e.g., resin.

Figure 7:
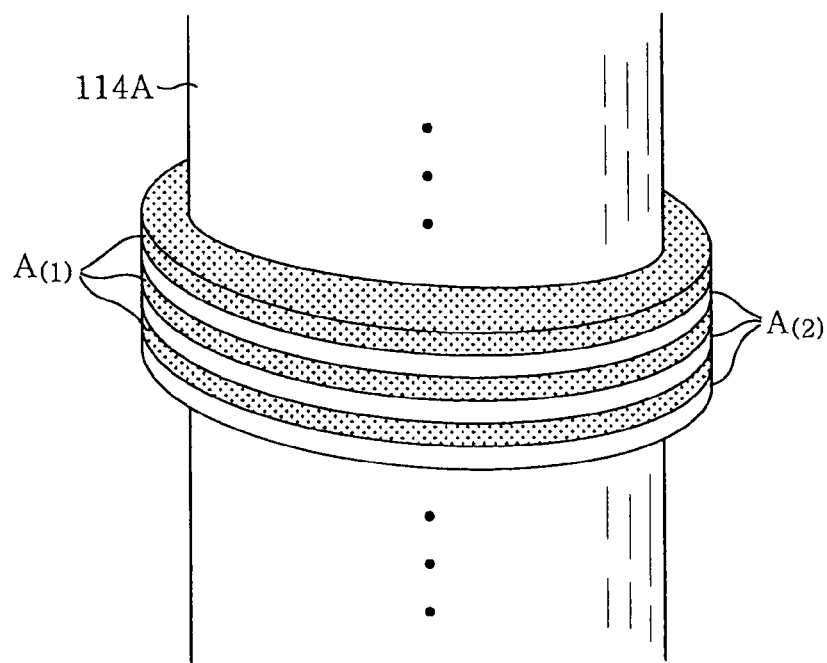
FIG. 7 is a perspective view illustrating a coil winding structure of two kinds of air-core coils mounted to a common bobbin in the embodiment.
Figure 8:
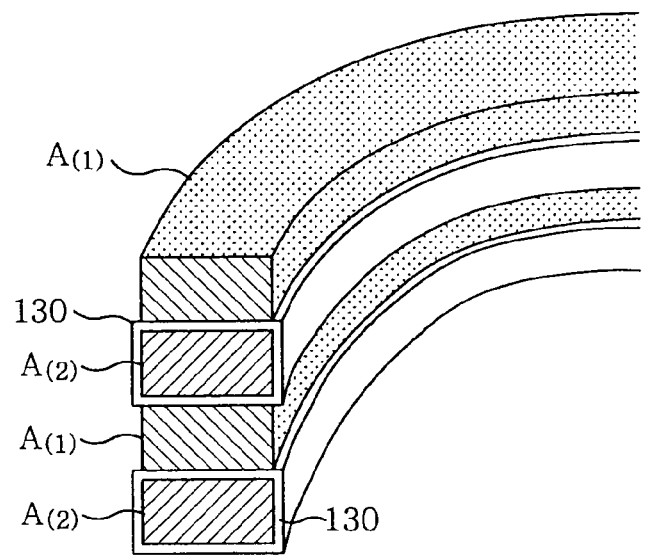
FIG. 8 is a partially sectional perspective view illustrating the coil winding structure in the embodiment.

In this regard, the air-core coil subunits A(1) and A(2) have a distinctive coil winding structure. The air-core coil subunits A(1) and A(2) are constructed from conductive coil wires of the same length spirally wound side by side around the outer circumferential surface of the bobbin 114A, the conductive coil wires being alternately disposed in an axial direction of the bobbin 114A as illustrated in FIG. 7. As can be seen in FIG. 8, the conductive coil wires of the air-core coil subunits A(1) and A(2) are formed of rectangular or sheet-like copper wires preferably having the same cross-sectional area. In order to prevent occurrence of short-circuit between the conductive coil wires, the conductive coil wire of one of the air-core coil subunits A(1) and A(2), e.g., the air-core coil subunit A(2), is covered with an insulation coat, e.g., a tube 130 made of Teflon (registered trademark).

On the other hand, the second stage air-core coil subunits B(1) and B(2) of the first and second power supply lines 100(1) and 100(2) are concentrically mounted to an upstanding bobbin 114B provided substantially at the center region in the casing 120. The coil winding structure of the air-core coil subunits B(1) and B(2) is the same as that of the air-core coil subunits A(1) and A(2) set forth above. In other words, the air-core coil subunits B(1) and B(2) are constructed from conductive coil wires of the same length spirally wound side by side around the outer circumferential surface of the bobbin 114B, the conductive coil wires being alternately arranged in an axially direction of the bobbin 114B.

As shown in FIG. 6, filter terminals T(1) and T(2) are attached to the top ends of the first stage air-core coil subunits A(1) and A(2). The first stage air-core coil subunits A(1) and A(2) and the second stage air-core coil subunits B(1) and B(2) are joined to each other at their lower ends through a connecting conductor 122. Furthermore, the second stage air-core coil subunits B(1) and B(2) and the initial stage capacitor 110(1) and 110(2) are joined to each other at their upper ends through a connecting conductor 124. The conductive coil wires that form the respective air-core coil subunits may be used as the connecting conductors 122 and 124.

As described above, the two series of air-core coils mounted to a common bobbin are wound in the same spiral direction according to the present embodiment. In other words, the first stage air-core coil subunit A(1) of the first series, i.e., the first power supply line 100(1), and the first stage air-core coil subunit A(2) of the second series, i.e., the second power supply line 100(2), have their coil windings wound in the same spiral direction. This ensures that the radio frequency currents fed from the susceptor 12 to the two power supply lines via the inner heating wire 40(IN) and the power supply conductor 52(IN) flow through the air-core coil subunits A(1) and A(2) in the same spiral direction. If such is the case, that is, if the radio frequency currents simultaneously flow through the air-core coil subunits A(1) and A(2), the magnetic fluxes formed across the air-core coil subunits A(1) and A(2) are oriented in the same direction. Thus, mutual inductance having a positive coupling constant is obtained between the air-core coil subunits A(1) and A(2). Similarly, the second stage air-core coil subunits B(1) and B(2) mounted to the bobbin 114B have their coil windings wound in the same spiral direction. As a consequence, mutual inductance having a positive coupling constant is obtained between the air-core coils B(1) and B(2).

Furthermore, the two series of air-core coils mounted to a common bobbin are identical in diameter and length. In other words, the first stage air-core coil subunits A(1) and A(2) mounted to the bobbin 114A are formed of conductive coil wires of the same material and size (diameter and length). Each of the first stage air-core coil subunits A(1) and A(2) has a coil diameter defined by the outer diameter of the bobbin 114A. In the first stage air-core coil subunits A(1) and A(2), the respective conductive coil wires are alternately disposed in the axial direction of the bobbin 114A. Similarly, the second stage air-core coil subunits B(1) and B(2) mounted to the bobbin 114B are formed of conductive coil wires of the same material and size (diameter and length). Each of the second stage air-core coil subunits B(1) and B(2) has a coil diameter defined by the outer diameter of the bobbin 114B. The respective conductive coil wires of the second stage air-core coil subunits B(1) and B(2) are alternately disposed in the axial direction of the bobbin 114B.

In such a coil winding structure, the first stage air-core coil subunits A(1) and A(2) have the same self-inductance, and the mutual inductance between the first stage air-core coil subunits A(1) and A(2) becomes greatest. Similarly, the second stage air-core coil subunits B(1) and B(2) have the same self-inductance, and the mutual inductance between the second stage air-core coil subunits B(1) and B(2) becomes greatest. As will be described later, this is significant in reducing the radio frequency power loss in the filter unit 54(IN) or 54(OUT) and eventually reducing the apparatus-dependent difference in the radio frequency power loss.

With the present embodiment, the spiral coil winding directions in the horizontally neighboring bobbins 114A and 114B are such that the directions of axial magnetic fields generated in the coil center portions are opposite to each other. For example, when magnetic force lines axially downwardly penetrate the center of air-core coil subunits A(1) and A(2), magnetic force lines axially upwardly penetrate the center of the neighboring air-core coil subunits B(1) and B(2). This ensures that the radio frequency currents reversely flow in the spatially opposite spiral directions between the serially connected the first stage and the second stage air-core coil subunit A(1) and B(1) and between the serially connected the first stage and the second stage air-core coil subunit A(2) and B(2). As a consequence, mutual inductance having a positive coupling constant is obtained between the air-core coil subunits A(1) and A(2) of the bobbin 114A and the air-core coil subunits B(1) and B(2) of the bobbin 114B. This also contributes to reducing the radio frequency power loss in the filter unit 54(IN) or 54(OUT).

As set forth above, the air-core coil subunits A(1) and B(1) (or A(2) and B(2)) received within the casing 120 have increased self-inductance and maximized mutual inductance, which makes it possible to realize combined inductance of 5 μH or more in the initial stage coil 108(1) (or 108(2)) formed of the air-core coil subunits.

In the present embodiment, it is preferred that the first stage air-core coil subunits A(1) and A(2) have increased inductance to minimize the radio frequency power loss. For that reason, the winding number of the first stage air-core coil subunits A(1) and A(2) is set greater than the winding number of the second stage air-core coil subunits B(1) and B(2) as can be seen in FIG. 6.

It is obvious in reality that the initial stage coil 108(1) (or 108(2)) has stray capacitance and resultant loss (resistance). Minimization of the stray capacitance is significant in reducing the power loss in the initial stage coil 108(1) (or 108(2)). From this point of view, the air-core coil subunits A(1) and B(1) (or A(2) and B(2)) that form the initial stage coil 108(1) (or 108(2)) are all spaced apart 10 mm or more from the inner wall surface (ground potential surface) of the casing 120 in the present embodiment. Therefore, a combined stray capacitance between the initial stage coil 108(1) (or 108(2)) and the ground potential portion, i.e., a combined stray grounded capacitance, is restrained to 30 pF or less.

If the total inductance of the air-core coil subunits A(1) and B(1) is equal to that of the air-core coil subunits A(2) and B(2), the total stray grounded capacitances become smaller as the winding numbers of the first stage air-core coil subunits A(1) and A(2) become greater. Furthermore, if the total stray grounded capacitance of the air-core coil subunits A(1) and B(1) is equal to that of the air-core coil subunits A(2) and B(2), the total stray grounded capacitances become smaller as the stray capacitances of the first stage air-core coil subunits A(1) and A(2) become smaller. This was confirmed through the simulations and experiments conducted by the present inventors.

As described above, the total combined stray grounded capacitances of the initial stage coils 108(1) and 108(2) can be reduced in a most effective way by increasing the winding numbers of the first stage air-core coil subunits A(1) and A(2) or by reducing the stray grounded capacitances thereof. In this sense, it is preferred that the first stage air-core coil subunits A(1) and A(2) and the casing 120 are spaced apart from each other with an increased gap distance. It is also preferred that the winding numbers of the first stage air-core coil subunits A(1) and A(2) are set greater than the winding numbers of the second stage air-core coil subunits B(1) and B(2) as much as possible.

As shown in FIGS. 5 and 6, a box 126 made of, e.g., resin, is attached to the sidewall of the casing 120 placed close to the second stage air-core coil subunits B(1) and B(2). The next stage LC low-pass filters 106(1) and 106(2) are all received in the box 126. The electric cable 56(IN) is arranged below the box 126. A conductor plate 128 of ground potential serving as an electromagnetic shield is provided between the second stage air-core coil subunits B(1) and B(2) and the box 126. The initial stage capacitors 110(1) and 110(2) are mounted to the conductor plate 128.

In the plasma etching apparatus of the present embodiment, parts of the radio frequency power applied from the first radio frequency power supply 28 to the susceptor 12 flow into the filter circuits 102(1) and 102(2) via the inner heating element 40(IN) and the first and the second power supply line 100(1) and 100(2). The radio frequency currents flowing into the filter circuits 102(1) and 102(2) are attenuated to, e.g., 1/10 or less in the initial stage LC low-pass filters 104(1) and 104(2), so that small amounts of the radio frequency currents are introduced into the next stage LC low-pass filters 106(1) and 106(2). Therefore, the power loss in the next stage coils 112(1) and 112(2) is negligibly small, which makes it possible to construct the next stage coils 112(1) and 112(2), each of which includes a small size magnetic core can be arranged therein. Since it is undesirable that the next stage coils 112(1) and 112(2) are magnetically coupled with the second stage air-core coil subunits B(1) and B(2) lying adjacent thereto, they are shielded by the conductor plate 128. The conductor plate 128 is preferably made of the same material as used in forming the casing 120.

As stated above, most of the radio frequency power flowing from the susceptor 12 into the filter circuits 102(1) and 102(2) through the power supply lines 100(1) and 100(2) are attenuated and dissipated in the initial stage LC low-pass filters 104(1) and 104(2) which means that the radio frequency power loss of the filter circuits 102(1) and 102(2) is mostly generated in the initial stage LC low-pass filters 104(1) and 104(2).

Figure 9:
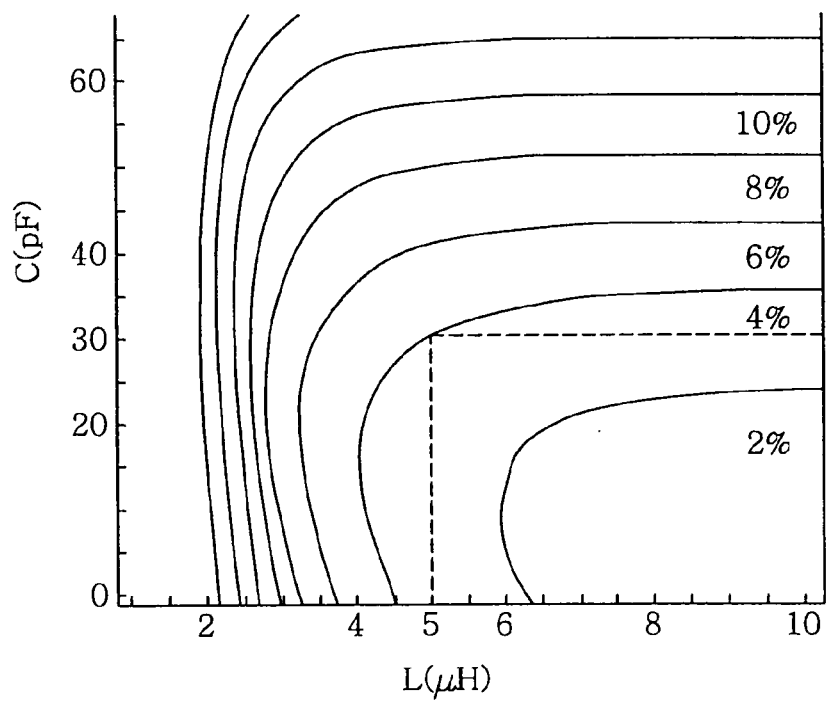
FIG. 9 is a view representing the relationship between the inductance and stray capacitance of an initial stage coil and ratio of the filter power loss (%) in the embodiment.
Figure 10A:
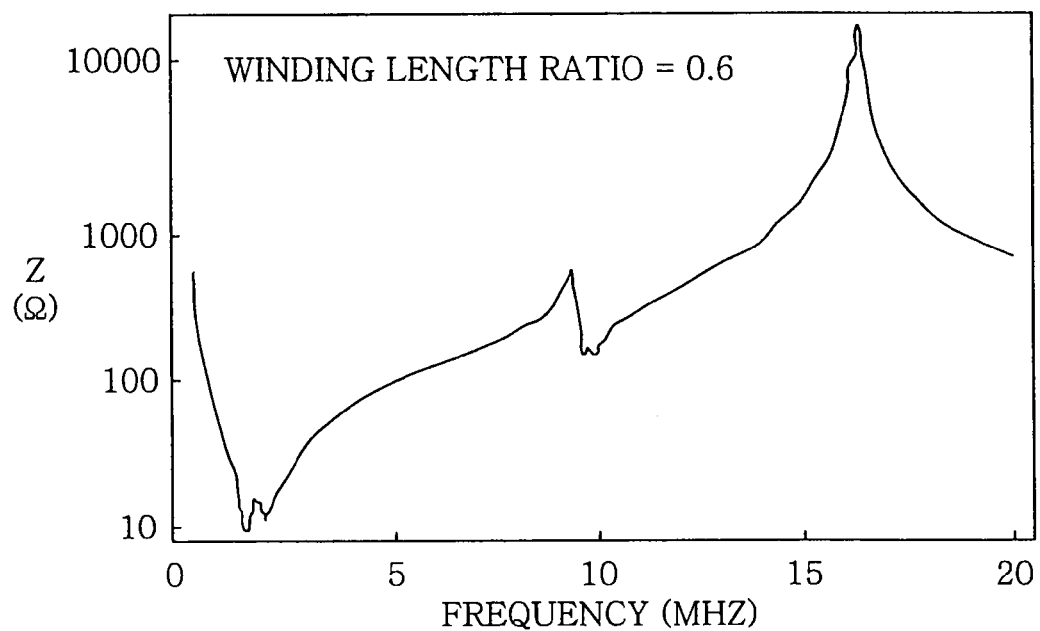
FIG. 10A is a view representing the frequency characteristic of impedance in case where the coil winding ratio of the initial stage coil is set equal to 0.6 in the coil winding structure of the embodiment.
Figure 10B:
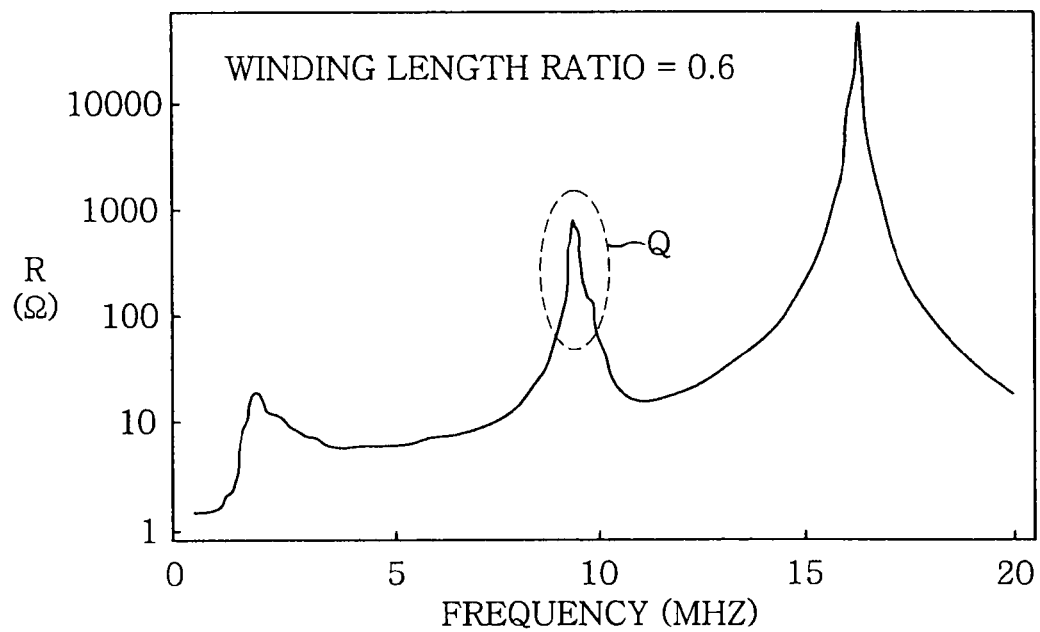
FIG. 10B is a view representing the frequency characteristic of a real resistance component in case where the coil winding ratio of the initial stage coil is set equal to 0.6 in the coil winding structure of the embodiment.
Figure 11:
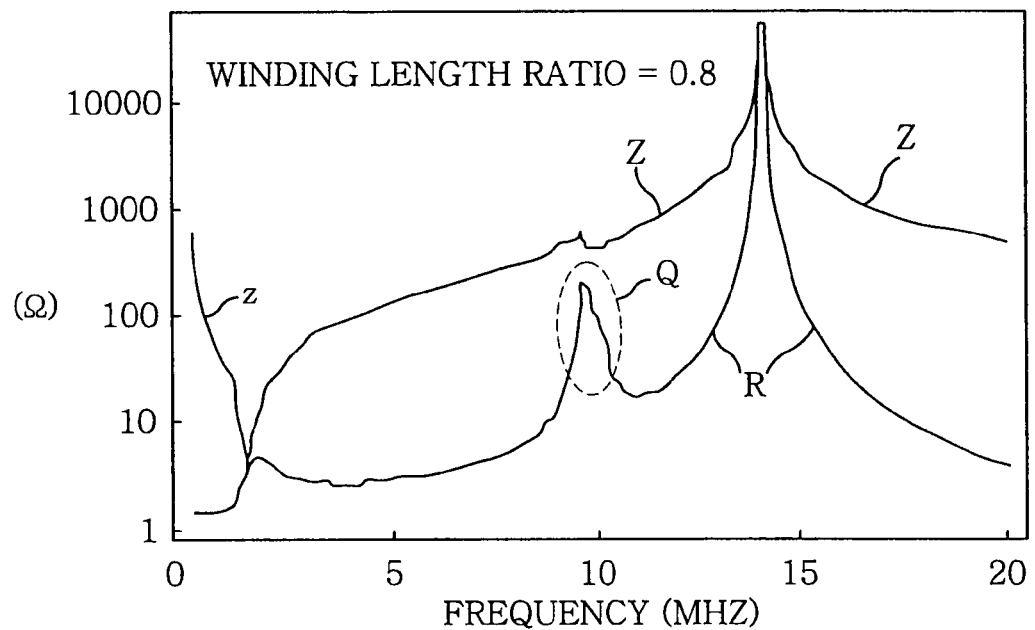
FIG. 11 is a view representing the frequency characteristic of impedance and the frequency characteristic a real resistance component in case where the coil winding ratio of the initial stage coil is set equal to 0.8 in the coil winding structure of the embodiment.
Figure 12:
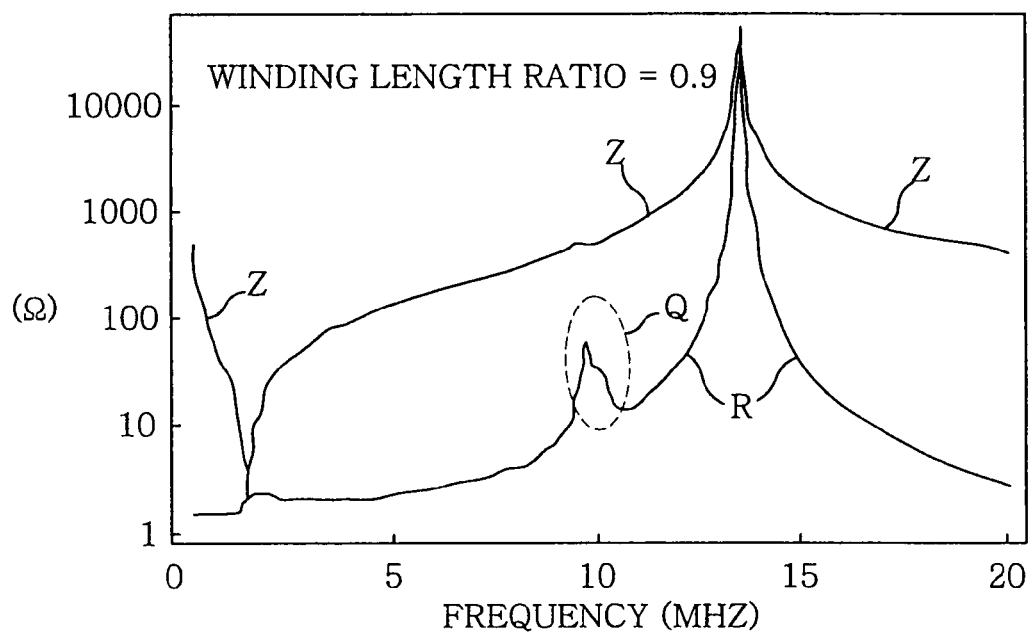
FIG. 12 is a view representing the frequency characteristic of impedance and the frequency characteristic a real resistance component in case where the coil winding ratio of the initial stage coil is set equal to 0.9 in the coil winding structure of the embodiment.
Figure 13:
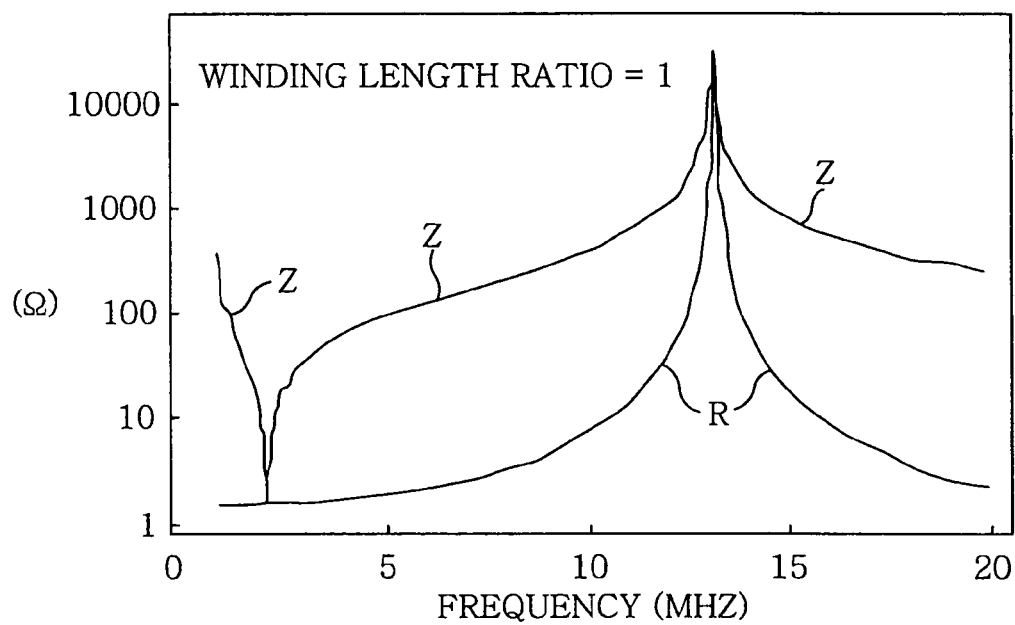
FIG. 13 is a view representing the frequency characteristic of impedance and the frequency characteristic a real resistance component in case where the coil winding ratio of the initial stage coil is set equal to 1 in the coil winding structure of the embodiment.
Figure 14:
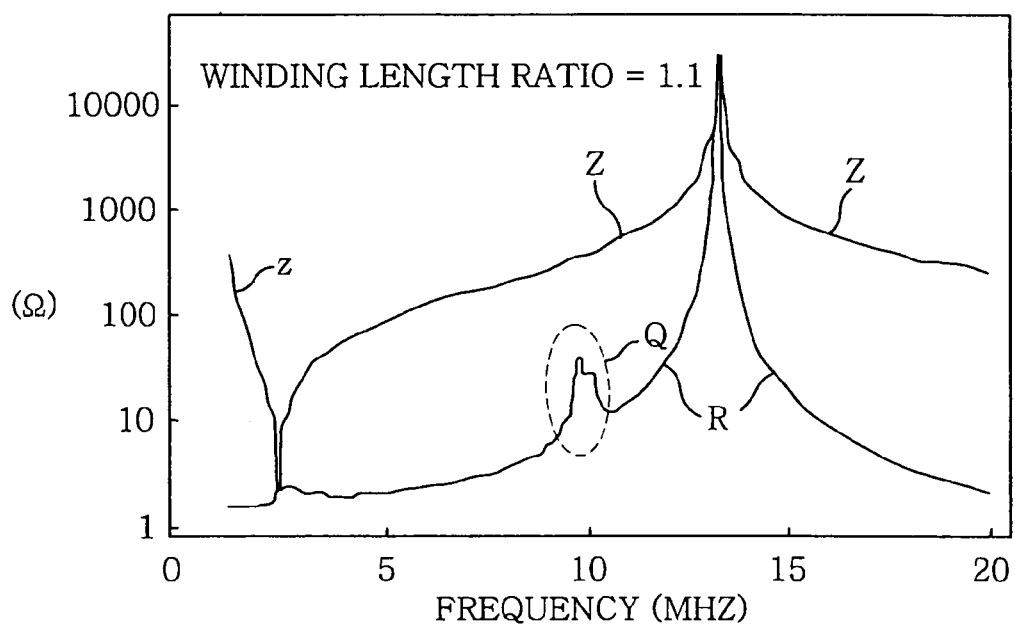
FIG. 14 is a view representing the frequency characteristic of impedance and the frequency characteristic a real resistance component in case where the coil winding ratio of the initial stage coil is set equal to 1.1 in the coil winding structure of the embodiment.
Figure 15:
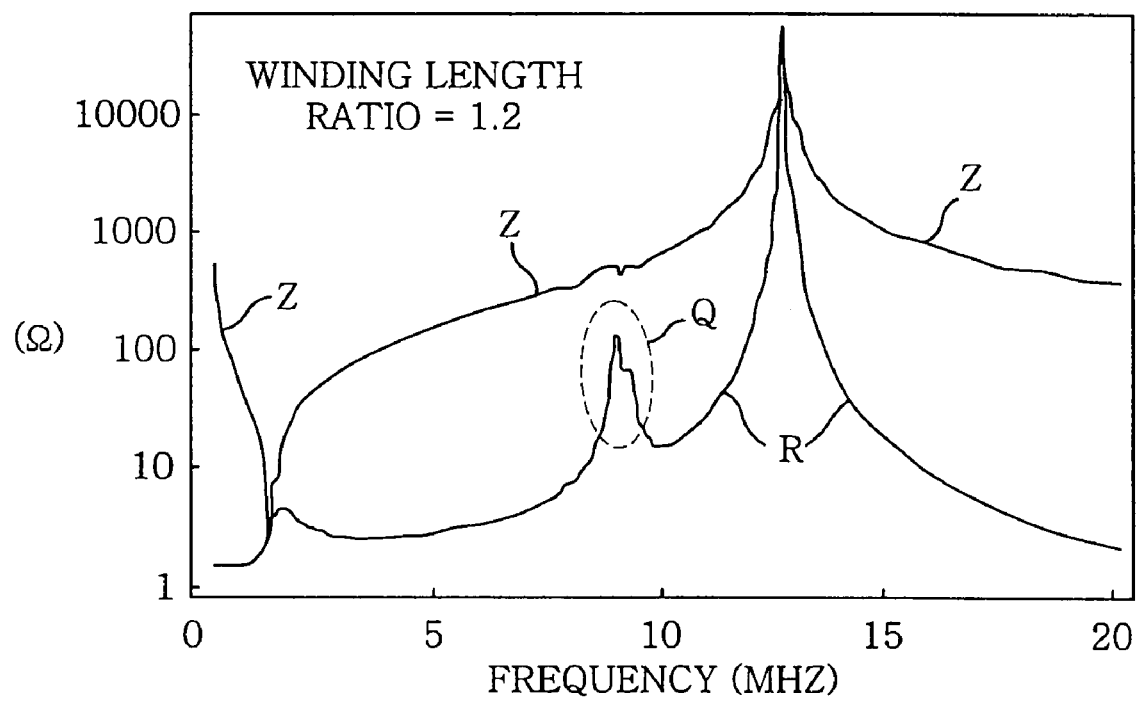
FIG. 15 is a view representing the frequency characteristic of impedance and the frequency characteristic a real resistance component in case where the coil winding ratio of the initial stage coil is set equal to 1.2 in the coil winding structure of the embodiment.

The present inventors have conducted a simulation to find a ratio of the radio frequency power loss generated in the filter circuits 102(1) and 102(2) to a total radio frequency power (an output power of the radio frequency power supply 28), i.e., a ratio of the filter power loss(%), in the plasma etching apparatus of the present embodiment. Illustrated in FIG. 9 is the resultant contour map in which a vertical axis and a horizontal axis indicate the combined stray grounded capacitance C and the combined inductance L of the initial stage coils 108(1) and 108(2), respectively. The combined inductance L and the combined stray grounded capacitance C denote an apparent combined inductance and the combined stray grounded capacitance in the initial stage coils 108(1) and 108(2) as viewed from the heating element 40.

As illustrated in FIG. 9, the ratio of the filter power loss (%) becomes smaller as the inductance L becomes greater and as the stray capacitance C becomes smaller. It is found that, in the region (demarcated by a dot line) where the inductance L is equal to or greater than 5 μH and the stray capacitance C is equal to or smaller than 30 pF, the ratio of the filter power loss (%) always falls below 4% regardless of a change in the inductance L and the stray capacitance C. In the region outside the above-noted region, it is difficult or impossible to maintain the ratio of the filter power loss (%) below 4%. Moreover, the ratio of the filter power loss (%) is greatly changed by the small change in the inductance L or the stray capacitance C.

In a typical plasma etching apparatus, the variance in the reproducibility tolerance of an etching rate is restricted to about 2% or less. Thus, it is known that the ratio of the filter power loss (%) needs to be equal to or smaller than two times of the variance in the reproducibility tolerance, i.e., about 4% or less. Therefore, if the inductance L is equal to or greater than 5 μH, and the stray capacitance C is equal to or smaller than 30 pF, it is possible to reliably clear the reproducibility tolerance of an etching rate.

In the present embodiment, the numerical value conditions of the inductance L and the stray capacitance C can be satisfied by constructing the filter unit 54(IN) as described above. Particularly, the initial stage LC low-pass filter 104(1) and 104(2) have a coil winding structure that assures the same self-inductance and the maximum mutual inductance between the air-core coil subunits A(1) and A(2) (or B(1) and B(2)) mounted to the common bobbin 114A or 114B.

The present inventors have conducted a equivalent circuit simulation to find the combined impedance Z and the real resistance component R of the initial stage coils 108(1) and 108(2) in the plasma etching apparatus of the present embodiment available when the winding length ratio of the initial stage coil 108(1) of the first power supply line 100(1) to the initial stage coil 108(2) of the second power supply line 100(2) is changed within a range of from 0.6 to 1.2. The results are illustrated in FIGS. 10A through 15.

The results of simulation reveal that there is a remarkable difference in the frequency characteristics of the real resistance component R between the case where the winding length ratio is equal to 1 and the cases where the winding length ratio is other than 1. More specifically, when the winding length ratio is other than 1, i.e., 0.6 (see FIG. 10B), 0.8 (see FIG. 11), 0.9 (see FIG. 12), 1.1 (see FIG. 14) or 1.2 (see FIG. 15), a horn-like abnormal increase Q of the real resistance component R always appears in the frequency of about 9 MHz. The abnormal increase Q of the real resistance component R does not appear when the winding length ratio is equal to 1 (see FIG. 13). The abnormal increase Q of the real resistance component R in the frequency of about 9 MHz becomes greater as the winding length ratio goes away from 1. This means that the abnormal increase Q is gradually reduced as the winding length ratio comes closer to 1. Although the frequency region where the abnormal increase Q of the real resistance component R appears in case of the winding length ratio being other than 1 is about 9 MHz in the illustrated example, the present inventors have experimentally confirmed that the frequency region noted above varies with the construction of other neighboring parts or the frequency characteristics thereof and hence shows an apparatus-dependent difference.

In the simulation frequency characteristics (illustrated in FIGS. 10A through 15), the real resistance component R is always increased like a horn in the frequency of about 16 MHz regardless of the winding length ratio. Because the initial stage coils 108(1) and 108(2) have parallel resonance characteristics, this is a natural phenomenon and this characteristics is not an unusual (abnormal).

If the unusual abnormal increase Q accompanied by the apparatus-dependent difference appears in the frequency characteristics of the real resistance component R of the initial stage coils 108(1) and 108(2) arranged within the filter unit 54(IN), the ratio of the filter power loss is extraordinarily changed in an increasing direction, thereby reducing the reproducibility of process performance. Since the present embodiment employs a coil winding structure stably and reliably satisfying the requirement that the winding length ratio of the initial stage coils 108(1) and 108(2) to be equal to 1, it is possible to surely prevent the unusual abnormal increase Q from appearing in the frequency characteristics of the real resistance component R. It is also possible to keep the ratio of the filter power loss within its tolerance, thereby improving the reproducibility of process performance.

While a preferred embodiment has been described hereinabove, the present invention is not limited thereto. Modifications or changes may be made without departing from the scope of the invention.

Figure 16:
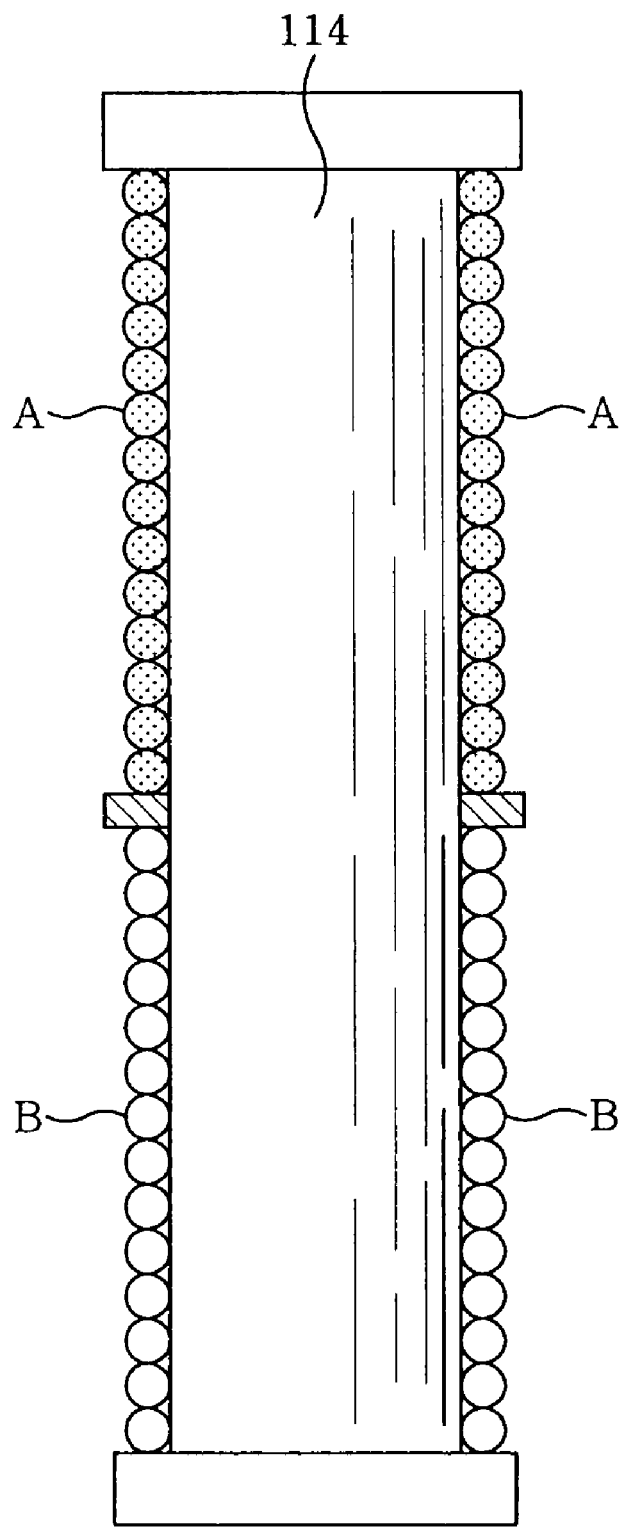
FIG. 16 is a view showing a modified example of the coil winding structure in accordance with the present invention.
Figure 17:
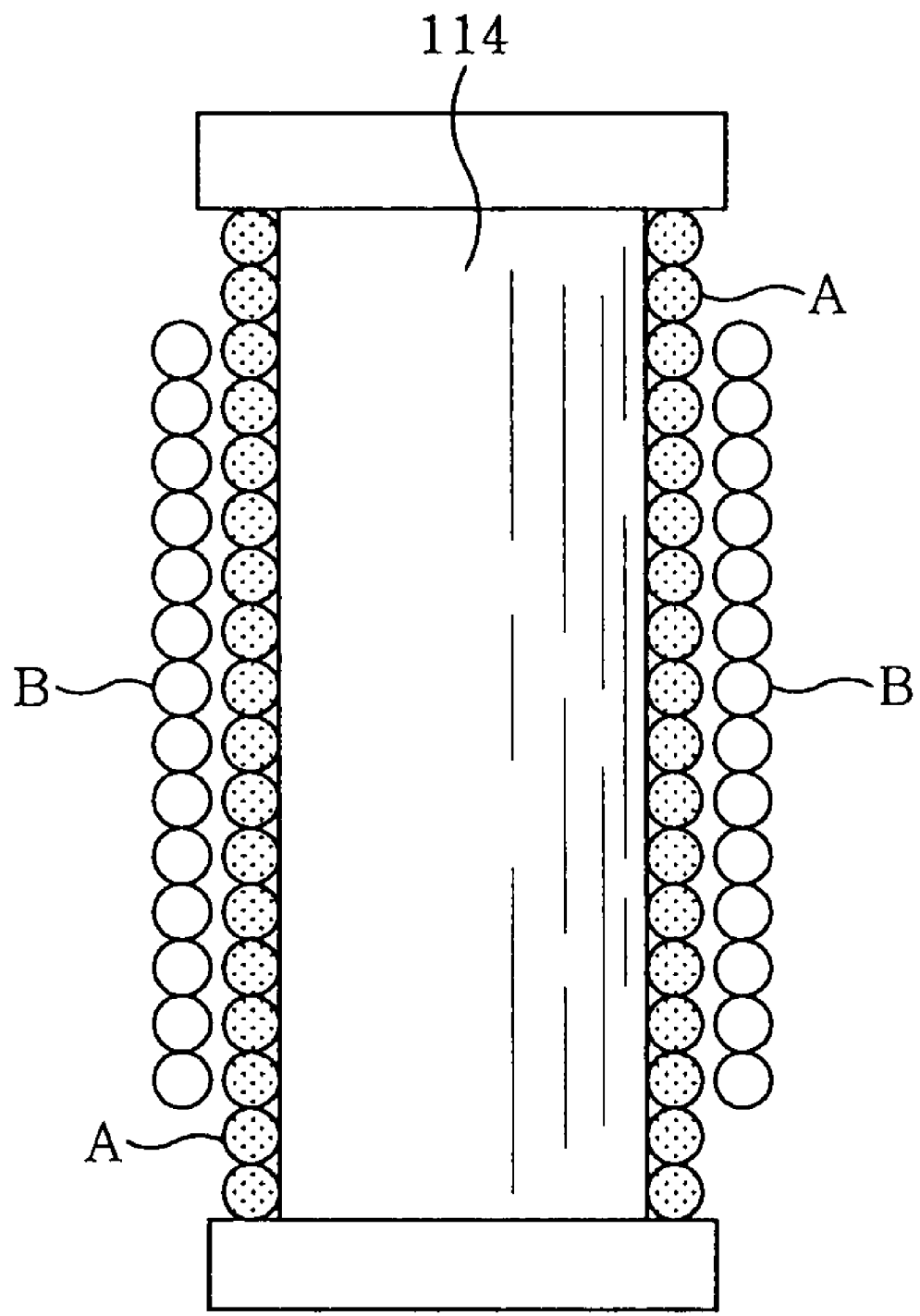
FIG. 17 is a view showing another modified example of the coil winding structure in accordance with the present invention.

For example, FIGS. 16 and 17 show modified examples of the coil winding structure in accordance with the present invention. The coil winding structure shown in FIG. 16 is the same as that of the present embodiment in that two series of coils A and B are mounted to a common bobbin 114 to have an equal coil diameter and in that the winding length ratio of the coils A and B is rendered equal to 1. However, the coils A and B do not have a construction in which the conductive wires thereof are alternately disposed in the axial direction of the bobbin. Thus, it is not possible to obtain maximum mutual inductance between the coils A and B. The coil winding structure shown in FIG. 17 is the same as that of the present embodiment in that two series of coils A and B are mounted to a common bobbin 114 and in that the winding length ratio of the coils A and B is rendered equal to 1. However, the coils A and B have different diameters and do not have a construction in which the conductive wires thereof are alternately disposed in the axial direction of the bobbin. For that reason, the coils A and B do not have the same self-inductance, and the mutual inductance between the coils A and B is not the maximum.

The coil winding structures shown in FIGS. 16 and 17 are lacking in a part of the requirements satisfied in the present embodiment. This reduces or halves the effect of improving the frequency characteristics of the real resistance component R, the ratio of the filter power loss and eventually the reproducibility of process performance.

While the heating element 40 of the susceptor 12 is radially divided into the inner heating wire 40(IN) and the outer heating wire 40(OUT) in the plasma etching apparatus of the present embodiment, it may be a non-divided or integral type, in which case the heater power supply and the power supply line may be provided in a single series.

In the present embodiment, each of the initial stage coils 108(1) and 108(2) of the filter units 54(IN) and 54(OUT) is divided into two air-core coil subunits A(1) and B(1) (or A(2) and B(2)). Alternatively, each of the initial stage coils 108(1) and 108(2) may be divided into, e.g., three air-core coil subunits A(1), B(1) and C(1) (or A(2), B(2) and C(2)). As another alternative, each of the initial stage coils 108(1) and 108(2) may be constructed from one air-core coil subunit A(1) or A(2).

The configuration of the filter circuits 102(1) and 102(2) may be modified in many different forms. For example, a third stage LC low-pass filer may be connected to the next stage LC low-pass filter 106(1) or 106(2) in an end-to-end relationship.

Wile the second radio frequency power (of 60 MHz) for the generation of plasma are applied to the shower head (upper electrode) 64 in the present embodiment, the present invention may find its application in a lower electrode dual frequency application type in which the second radio frequency power superposing with the first radio frequency power (of 13.56 MHz) is applied to the susceptor 12. Alternatively, it may be possible to employ a lower electrode single frequency application type in which the first radio frequency power (of 13.56 MHz) alone is applied to the susceptor 12 without applying any radio frequency power to the upper electrode 64. The frequency of the first radio frequency power applied to the susceptor 12 is not limited to 13.56 MHz but may be other values. The casing 120 of the filter unit 54 is not limited to the closed case structure but may be partially opened.

The present embodiment is directed to a filter circuit that attenuates the noise from the first radio frequency power for ion attraction generated in a pair of heater power supply lines 100(1) and 100(2) for electrically connecting the heating element 40 provided in the susceptor 12 inside the chamber 10 and the heater power supply 58 installed outside the chamber 10. However, the present invention is not limited to the filter circuit for power supply lines and may be applied to an arbitrary filter circuit provided in a pair of lines for electrically connecting specified electric parts arranged inside the chamber and power or signal circuits arranged outside the chamber. Therefore, it is possible to arbitrarily select the radio frequency power to be attenuated or interrupted by the filter circuit. The radio frequency power to be attenuated may be, for example, radio frequency power contributing primarily to the generation of plasma, radio frequency power due to harmonics or intermodulation distortions generated from plasma as a non-linear circuit.

The present invention is not limited to a plasma etching apparatus but may be applied to other plasma processing apparatuses for performing plasma CVD, plasma oxidation, plasma nitration, sputtering and the like. Furthermore, the substrate to be processed in the present invention is not limited to the semiconductor wafer but may be various kinds of flat panel displays, photo masks, CD substrates, printed substrate and so forth.

While the invention has been shown and described with respect to the embodiments, it will be understood by those skilled in the art that various changes and modifications may be made without departing from the scope of the invention as defined in the following claims.

What is claimed is:

1. A plasma processing apparatus comprising:
a processing chamber capable of being depressurized;
a first electrode arranged in the processing chamber, the first electrode being provided with a heating element;
a first radio frequency power supply for outputting a first radio frequency power, the first radio frequency power supply being electrically connected to the first electrode;
a heater power supply for supplying an electric power to the heating element;
a first and a second power supply line for electrically interconnecting the heating element and the heater power supply; and
a filter circuit provided on the first and the second power supply line for attenuating radio frequency noises coming from the heating element,
wherein, the filter circuit includes a first and a second air-core coil respectively provided on the first and the second power supply line at an initial stage of the filter circuit when viewed from the heating element, the air-core coils being in a coaxial relationship with each other and having substantially the same winding length,
the plasma processing apparatus further comprising a conductive casing for enclosing the air-core coils, the casing being grounded,
wherein each of the air-core coils is divided into two or more electrically serially connected air-core coil subunits arranged in the casing in a spatially parallel relationship.

2. The plasma processing apparatus of claim 1, wherein the first and the second air-core coil have substantially the same diameter.

3. The plasma processing apparatus of claim 1, wherein the first and the second air-core coil are arranged concentrically.

4. The plasma processing apparatus of claim 1, wherein an air-core coil subunit of each air-core coil disposed closest to the heating element has an inductance greater than that of each remaining air-core coil subunit.

5. The plasma processing apparatus of claim 1, wherein the air-core coil subunit of each air-core coil disposed closest to the heating element has a stray capacitance smallest than that of each remaining air-core coil subunit.

6. The plasma processing apparatus of claim 1, wherein the heating element is embedded in an insulator under a main surface of the first electrode.

7. The plasma processing apparatus of claim 1, wherein the first electrode is a lower electrode on which a substrate to be processed is mounted.

8. The plasma processing apparatus of claim 1, further comprising a second electrode facing the first electrode in parallel in the processing chamber, with a specified gap left between the first electrode and the second electrode.

9. The plasma processing apparatus of claim 8, further comprising a second radio frequency power supply electrically connected to the second electrode for outputting second radio frequency power having a frequency higher than that of the first radio frequency power.

10. A plasma processing apparatus comprising:
a processing chamber capable of being depressurized;
a first electrode arranged in the processing chamber, the first electrode being provided with a heating element;
a first radio frequency power supply for outputting a first radio frequency power, the first radio frequency power supply being electrically connected to the first electrode;
a heater power supply for supplying an electric power to the heating element;
a first and a second power supply line for electrically interconnecting the heating element and the heater power supply; and
a filter circuit provided on the first and the second power supply line for attenuating radio frequency noises coming from the heating element,
wherein, the filter circuit includes a first and a second air-core coil respectively provided on the first and the second power supply line at an initial stage of the filter circuit when viewed from the heating element, the first air-core coil having a first conductive coil wire, the second air-core coil having a second conductive coil wire, the first and the second conductive coil wires being spirally wound side-by-side around an outer circumferential surface of a common bobbin with a substantially same winding length,
the plasma processing apparatus further comprising a conductive casing for enclosing the air-core coils, the casing being grounded,
wherein each of the air-core coils is divided into two or more electrically serially connected air-core coil subunits arranged in the casing in a spatially parallel relationship.

11. The plasma processing apparatus of claim 10, wherein the first and the second conductive coil wires are alternately disposed in an axial direction of the bobbin.

12. The plasma processing apparatus of claim 11, wherein the first and the second conductive coil wires are coated with an insulating material.

13. The plasma processing apparatus of claim 12, wherein the first and the second conductive coil wires are formed of rectangular or sheet-like copper wires.

14. The plasma processing apparatus of claim 10, wherein an air-core coil subunit of each air-core coil disposed closest to the heating element has an inductance greater than that of each remaining air-core coil subunit.

15. The plasma processing apparatus of claim 10, wherein the air-core coil subunit of each air-core coil disposed closest to the heating element has a stray capacitance smallest than that of each remaining air-core coil subunit.

16. The plasma processing apparatus of claim 10, wherein the heating element is embedded in an insulator under a main surface of the first electrode.

17. The plasma processing apparatus of claim 10, wherein the first electrode is a lower electrode on which a substrate to be processed is mounted.

18. The plasma processing apparatus of claim 10, further comprising a second electrode facing the first electrode in parallel in the processing chamber, with a specified gap left between the first electrode and the second electrode.

19. The plasma processing apparatus of claim 18, further comprising a second radio frequency power supply electrically connected to the second electrode for outputting second radio frequency power having a frequency higher than that of the first radio frequency power.

20. A plasma processing apparatus comprising:
a processing chamber capable of being depressurized in which plasma processing is performed by using radio frequency power;
an electric part provided within the processing chamber;
an external power or signal circuit provided outside the processing chamber, the external circuit being electrically connected to the electric part via a first and a second line; and
a filter circuit provided in the first and the second line for attenuating radio frequency noises coming into the first and the second line through the electric part,
wherein, the filter circuit includes a first and a second air-core coil respectively provided on the first and the second line at an initial stage of the filter circuit when viewed from the electric part, the air-core coils being in a coaxial relationship with each other and having substantially the same winding length,
the plasma processing apparatus further comprising a conductive casing for enclosing the air-core coils, the casing being grounded,
wherein each of the air-core coils is divided into two or more electrically serially connected air-core coil subunits arranged in the casing in a spatially parallel relationship.

21. The plasma processing apparatus of claim 20, wherein the first and the second air-core coil have substantially the same diameter.

22. The plasma processing apparatus of claim 20, wherein the first and the second air-core coil are arranged concentrically.

23. The plasma processing apparatus of claim 20, wherein the filter circuit selectively attenuates noises from radio frequency power contributing primarily to generation of plasma of a processing gas in the processing chamber.

24. The plasma processing apparatus of claim 20, wherein the filter circuit selectively attenuates noises from radio frequency power contributing primarily to attraction of ions from plasma into an object to be processed in the processing chamber.

25. The plasma processing apparatus of claim 20, wherein the filter circuit selectively attenuates radio frequency noises due to harmonics or intermodulation distortions generated from plasma in the processing chamber.

26. A plasma processing apparatus comprising:
a processing chamber capable of being depressurized in which plasma processing is performed by using radio frequency power;
an electric part provided within the processing chamber;

an external power or signal circuit provided outside the processing chamber, the external circuit being electrically connected to the electric part via a first and a second line; and a filter circuit provided in the first and the second line for attenuating radio frequency noises coming into the first and the second line through the electric part, wherein the filter circuit includes a first and a second air-core coil respectively provided on the first and the second line at an initial stage of the filter circuit when viewed from the electric part, the first air-core coil having a first conductive coil wire, the second air-core coil having a second conductive coil wire, the first and the second conductive coil wires being spirally wound around an outer circumferential surface of a common bobbin with a substantially same winding length, the plasma processing apparatus further comprising a conductive casing for enclosing the air-core coils, the casing being grounded, wherein each of the air-core coils is divided into two or more electrically serially connected air-core coil subunits arranged in the casing in a spatially parallel relationship.

27. The plasma processing apparatus of claim 26, wherein the first and the second conductive coil wires are alternately disposed in an axial direction of the bobbin.

28. The plasma processing apparatus of claim 26, wherein the first and the second conductive coil wires are coated with an insulation material.

29. The plasma processing apparatus of claim 28, wherein the first and the second conductive coil wires are formed of rectangular or sheet-like copper wires.

30. The plasma processing apparatus of claim 26, wherein the filter circuit selectively attenuates noises from radio frequency power contributing primarily to generation of plasma of a processing gas in the processing chamber.

31. The plasma processing apparatus of claim 26, wherein the filter circuit selectively attenuates noises from radio frequency power contributing primarily to attraction of ions from plasma into an object to be processed in the processing chamber.

32. The plasma processing apparatus of claim 26, wherein the filter circuit selectively attenuates radio frequency noises due to harmonics or intermodulation distortions generated from plasma in the processing chamber.

* * * * *